United States Patent
Lin et al.

(10) Patent No.: US 9,607,958 B2
(45) Date of Patent: Mar. 28, 2017

(54) SEMICONDUCTOR DEVICE AND METHOD FOR FORMING OPENINGS AND TRENCHES IN INSULATING LAYER BY FIRST LDA AND SECOND LDA FOR RDL FORMATION

(71) Applicant: STATS ChipPAC, Ltd., Singapore (SG)

(72) Inventors: Yaojian Lin, Singapore (SG); Pandi C. Marimuthu, Singapore (SG); Kang Chen, Singapore (SH)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 14/512,614

(22) Filed: Oct. 13, 2014

(65) Prior Publication Data

US 2015/0061123 A1 Mar. 5, 2015

Related U.S. Application Data

(62) Division of application No. 13/426,561, filed on Mar. 21, 2012, now Pat. No. 8,900,929.

(51) Int. Cl.
*H01L 23/00* (2006.01)
*H01L 23/31* (2006.01)
(Continued)

(52) U.S. Cl.
CPC ............ *H01L 24/14* (2013.01); *H01L 21/561* (2013.01); *H01L 21/565* (2013.01);
(Continued)

(58) Field of Classification Search
CPC .......... H01L 24/14; H01L 24/03; H01L 24/05; H01L 24/11; H01L 24/13; H01L 21/561;
(Continued)

(56) References Cited

U.S. PATENT DOCUMENTS 6,271,469 B1 8/2001 Ma et al.
6,964,889 B2 11/2005 Ma et al.
(Continued)

OTHER PUBLICATIONS

Beyer et al., "Flexible Polyimide Interposer for CSP Preparation",Sep. 30, 1998, IEEE, pp. 112-115.*
(Continued)

*Primary Examiner* — Steven Loke
*Assistant Examiner* — Juanita Rhodes
(74) *Attorney, Agent, or Firm* — Robert D. Atkins; Patent Law Group: Atkins and Associates, P.C.

(57) ABSTRACT

A semiconductor device has a semiconductor die with an encapsulant deposited over the semiconductor die. A first insulating layer having high tensile strength and elongation is formed over the semiconductor die and encapsulant. A first portion of the first insulating layer is removed by a first laser direct ablation to form a plurality of openings in the first insulating layer. The openings extend partially through the first insulating layer or into the encapsulant. A second portion of the first insulating layer is removed by a second laser direct ablation to form a plurality of trenches in the first insulating layer. A conductive layer is formed in the openings and trenches of the first insulating layer. A second insulating layer is formed over the conductive layer. A portion of the second insulating layer is removed by a third laser direct ablation. Bumps are formed over the conductive layer.

19 Claims, 25 Drawing Sheets

(51) Int. Cl.
*H01L 23/29* (2006.01)
*H01L 21/56* (2006.01)
*H01L 23/538* (2006.01)
*H01L 23/498* (2006.01)

(52) U.S. Cl.
CPC .......... *H01L 21/568* (2013.01); *H01L 23/291* (2013.01); *H01L 23/3121* (2013.01); *H01L 23/3135* (2013.01); *H01L 23/49816* (2013.01); *H01L 23/5389* (2013.01); *H01L 24/03* (2013.01); *H01L 24/05* (2013.01); *H01L 24/19* (2013.01); *H01L 24/20* (2013.01); *H01L 24/11* (2013.01); *H01L 24/13* (2013.01); *H01L 2224/0236* (2013.01); *H01L 2224/02351* (2013.01); *H01L 2224/02372* (2013.01); *H01L 2224/02379* (2013.01); *H01L 2224/0345* (2013.01); *H01L 2224/0348* (2013.01); *H01L 2224/0361* (2013.01); *H01L 2224/0391* (2013.01); *H01L 2224/03462* (2013.01); *H01L 2224/03464* (2013.01); *H01L 2224/0401* (2013.01); *H01L 2224/04105* (2013.01); *H01L 2224/05548* (2013.01); *H01L 2224/05552* (2013.01); *H01L 2224/05557* (2013.01); *H01L 2224/05567* (2013.01); *H01L 2224/06181* (2013.01); *H01L 2224/1146* (2013.01); *H01L 2224/11334* (2013.01); *H01L 2224/11849* (2013.01); *H01L 2224/12105* (2013.01); *H01L 2224/13008* (2013.01); *H01L 2224/13022* (2013.01); *H01L 2224/13023* (2013.01); *H01L 2224/13024* (2013.01); *H01L 2224/13111* (2013.01); *H01L 2224/13113* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/94* (2013.01); *H01L 2924/00013* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/181* (2013.01); *H01L 2924/1815* (2013.01); *H01L 2924/18161* (2013.01); *H01L 2924/20101* (2013.01)

(58) Field of Classification Search
CPC ... H01L 21/565; H01L 21/568; H01L 23/291; H01L 23/3121; H01L 23/3135; H01L 23/49816; H01L 23/5389; H01L 2224/02351; H01L 2224/0236; H01L 2224/02372; H01L 2224/02379; H01L 2224/0345; H01L 2224/03462; H01L 2224/03464; H01L 2224/0348; H01L 2224/0361; H01L 2224/0391; H01L 2224/0401; H01L 2224/04105; H01L 2224/05548; H01L 2224/05552; H01L 2224/05567; H01L 2224/06181; H01L 2224/11334; H01L 2224/1146; H01L 2224/11849; H01L 2224/12105; H01L 2224/13008; H01L 2224/13022; H01L 2224/13023; H01L 2224/13024; H01L 2224/13111; H01L 2224/13113; H01L 2224/13124; H01L 2224/13139; H01L 2224/13144; H01L 2224/13147; H01L 2224/13155; H01L 2224/94; H01L 2924/01322; H01L 2924/12041; H01L 2924/1306; H01L 2924/13091; H01L 2924/1815; H01L 2924/18161; H01L 2924/20101

See application file for complete search history.

(56) References Cited

U.S. PATENT DOCUMENTS

| | | | |
|---|---|---|---|
| 2001/0007375 A1* | 7/2001 | Fjelstad | H01L 23/3114 257/773 |
| 2002/0127780 A1* | 9/2002 | Ma | H01L 21/561 438/127 |
| 2003/0032276 A1 | 2/2003 | Kim | |
| 2009/0152715 A1* | 6/2009 | Shim | H01L 21/568 257/737 |
| 2010/0290191 A1* | 11/2010 | Lin | H01L 23/49816 361/704 |
| 2011/0062575 A1* | 3/2011 | Lin | H01L 23/13 257/690 |
| 2011/0062590 A1* | 3/2011 | Lu | H01L 23/3171 257/773 |
| 2011/0198762 A1* | 8/2011 | Scanlan | H01L 23/528 257/793 |
| 2013/0049217 A1* | 2/2013 | Gong | H01L 23/49822 257/774 |

OTHER PUBLICATIONS

Beyer, Volker et al., "Flexible Polyimide Interposer for CSP Preparation", Sep. 1998, 3rd Internation Conference on Adhesive Joining and Coating Technology in Electronics Manufacturing, pp. 112-115.

* cited by examiner

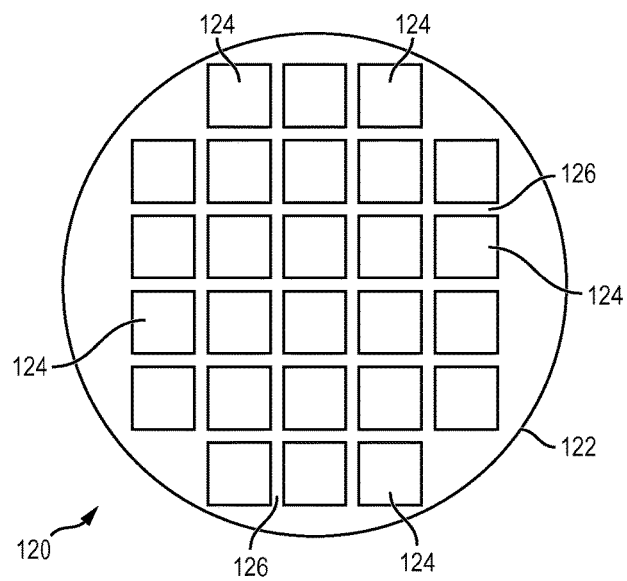
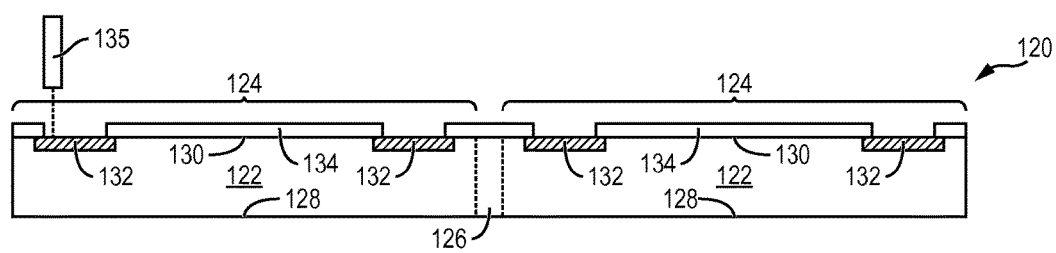
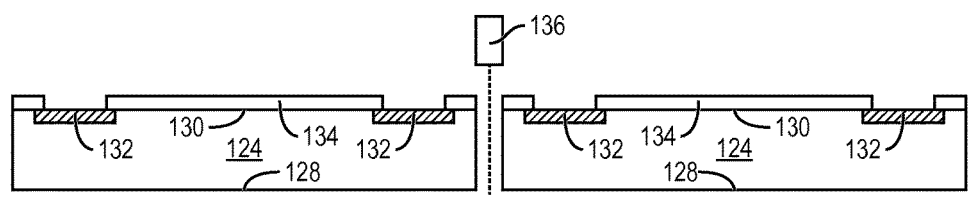

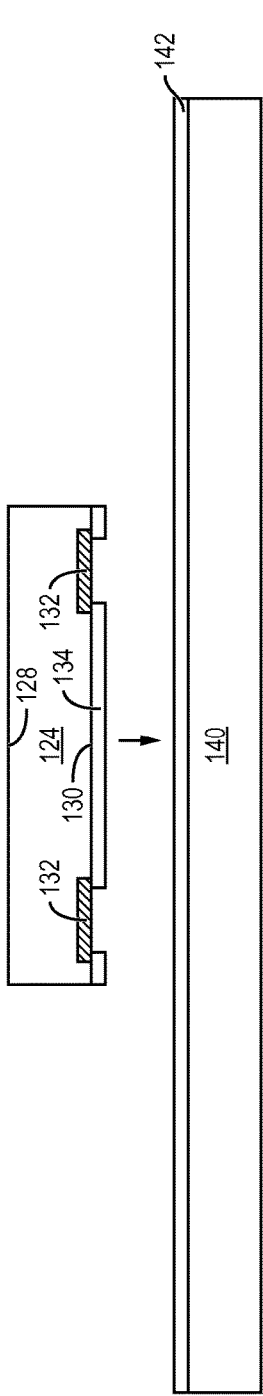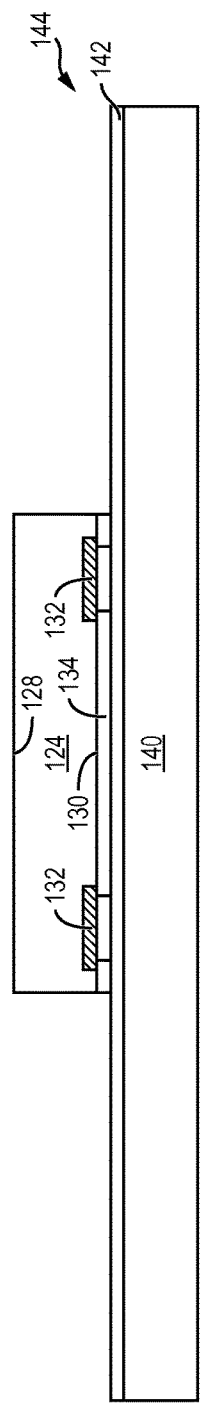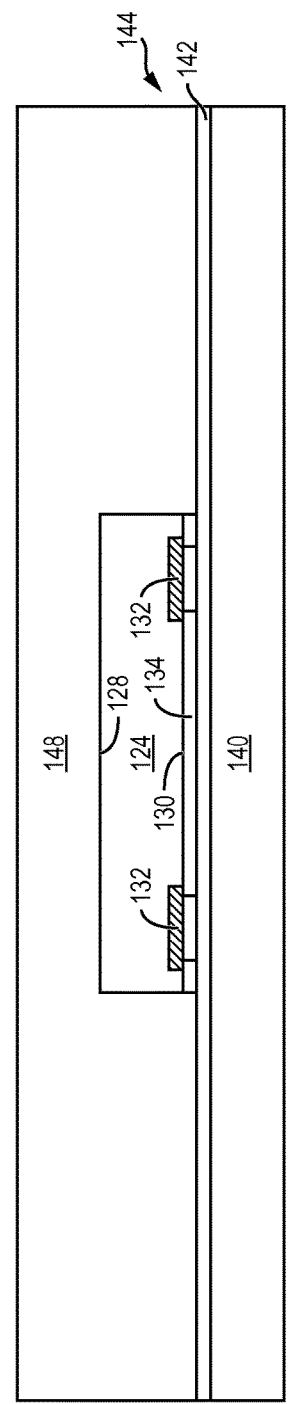

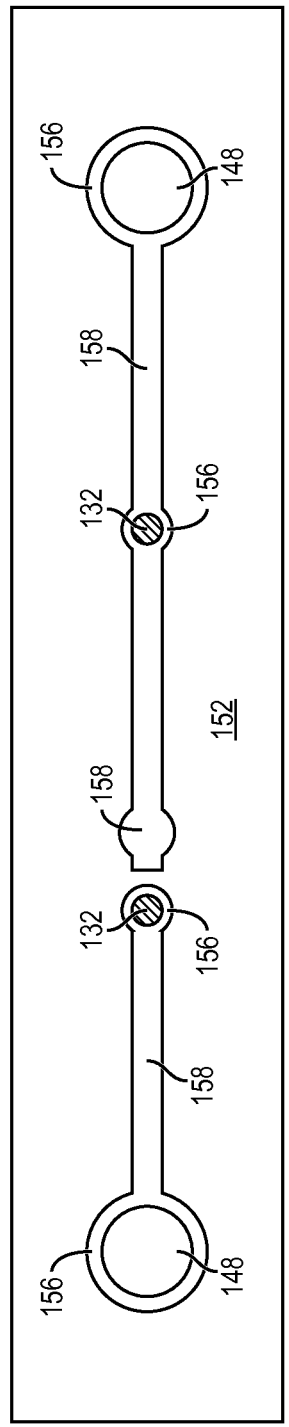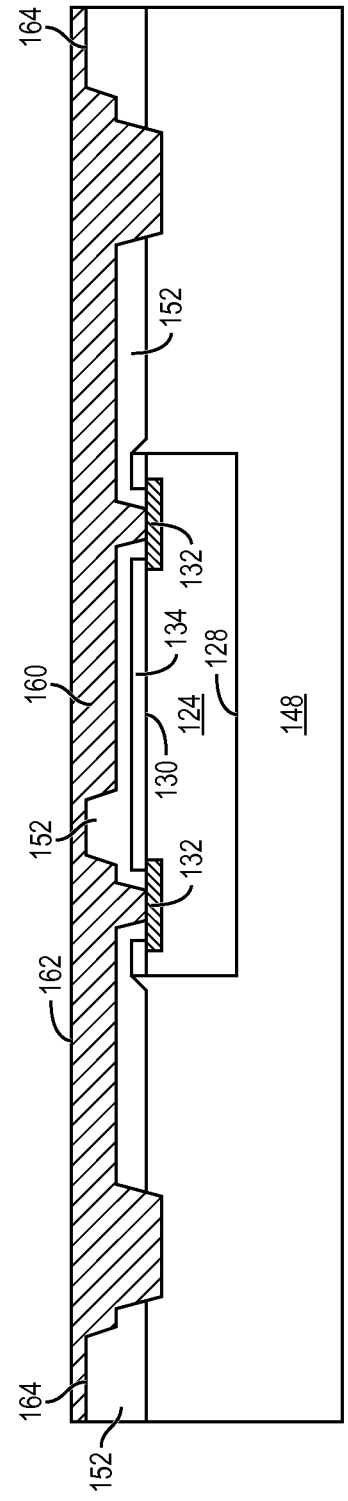

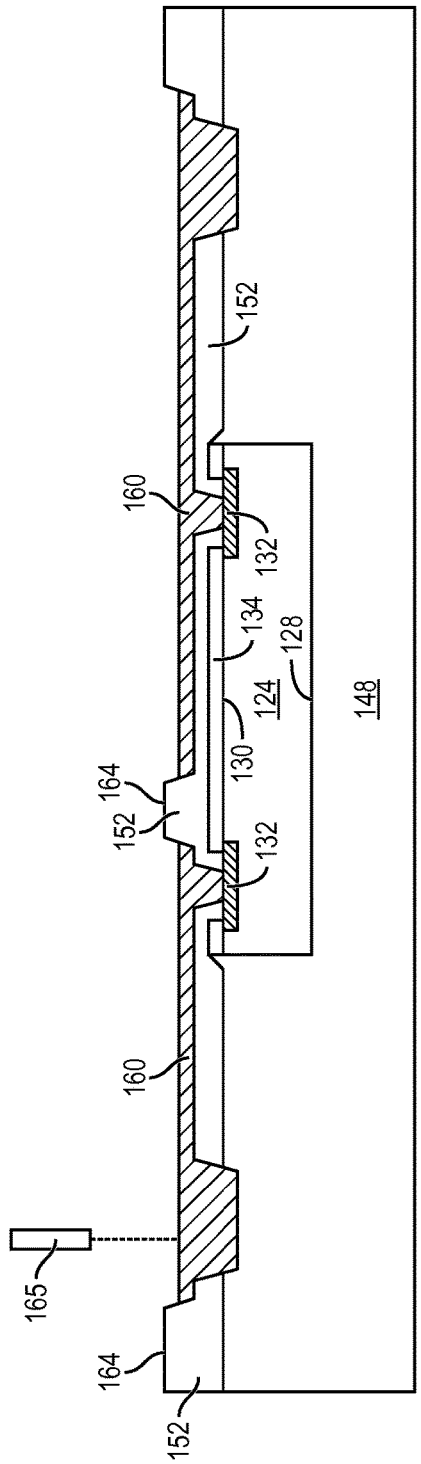
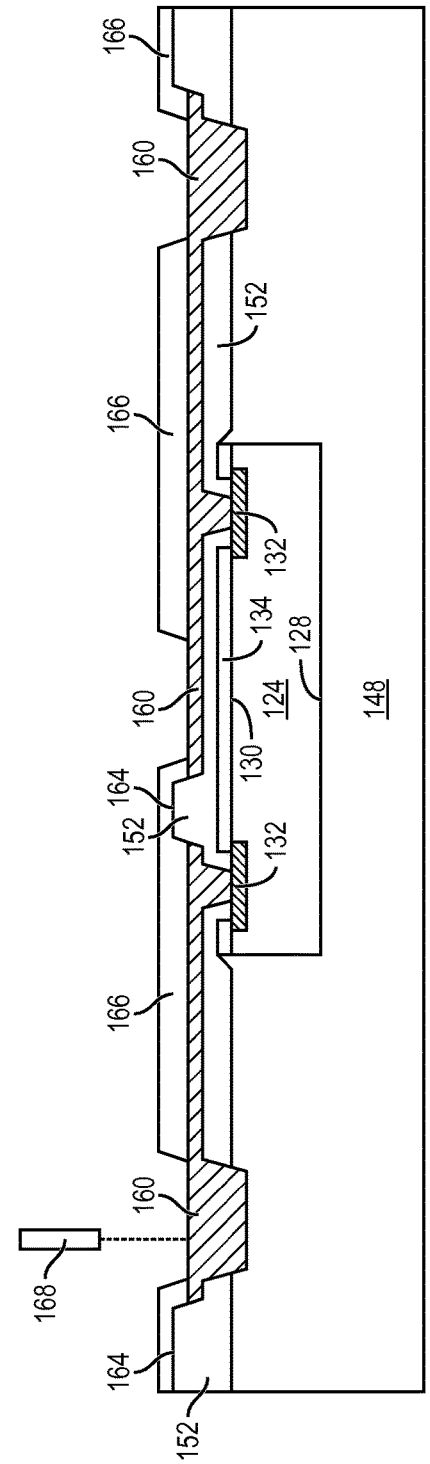

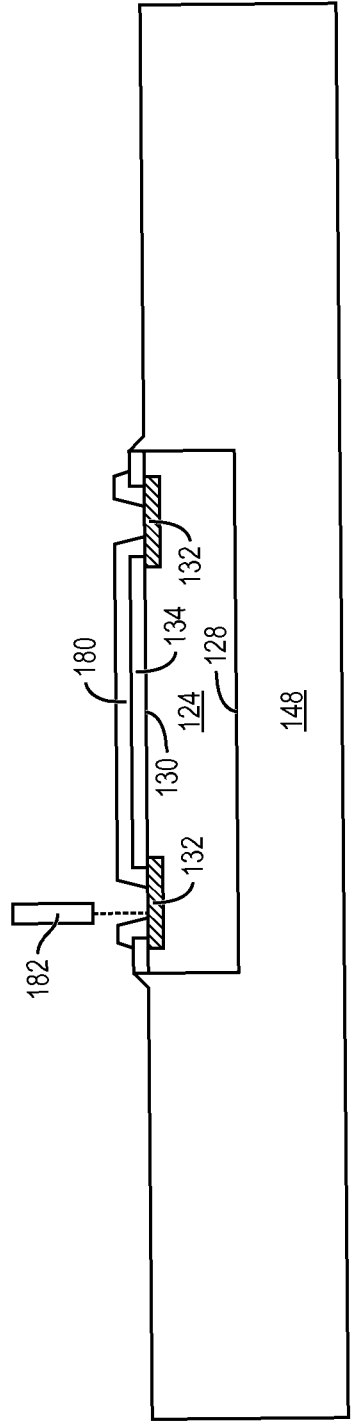
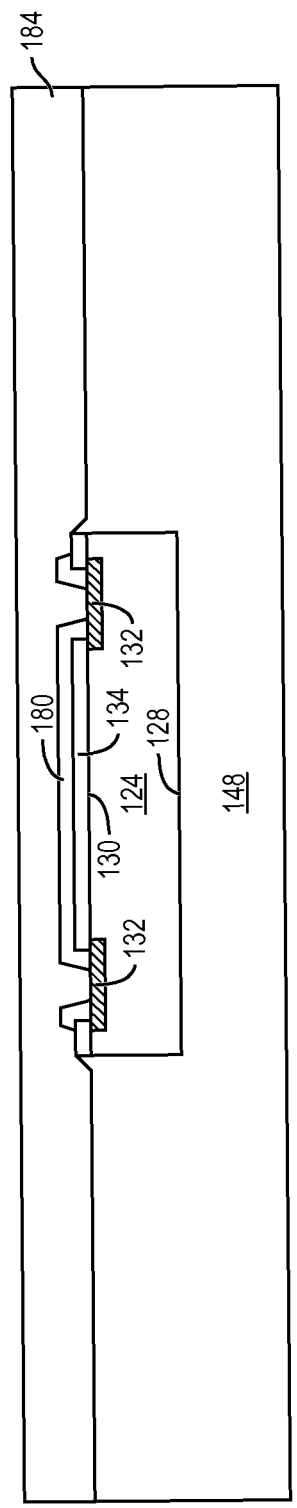

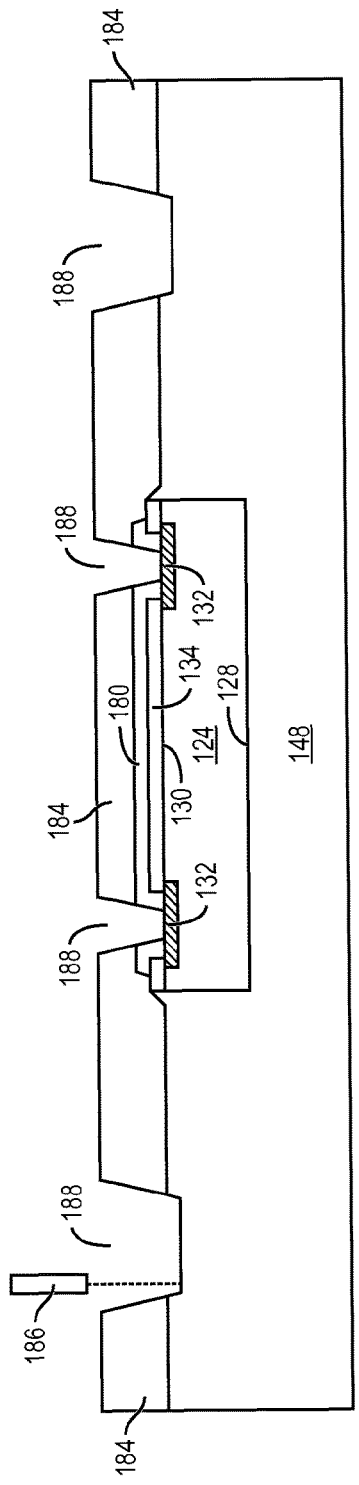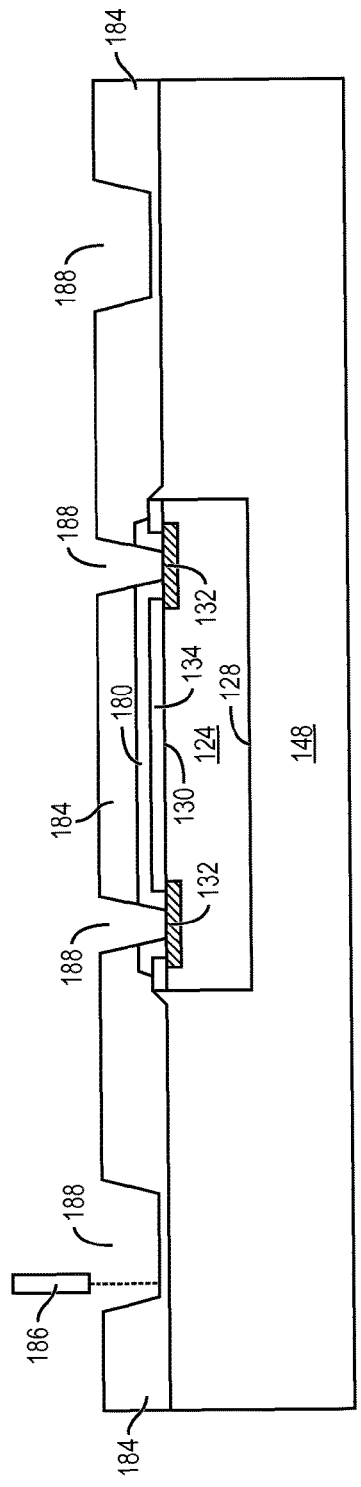

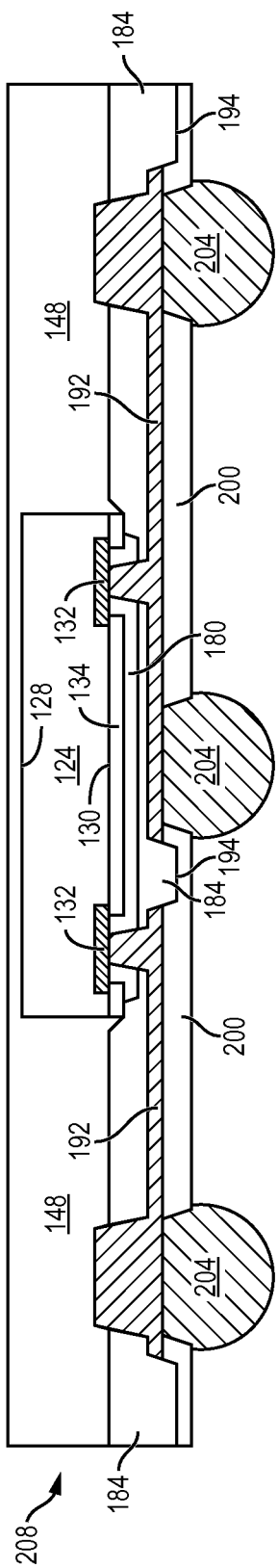
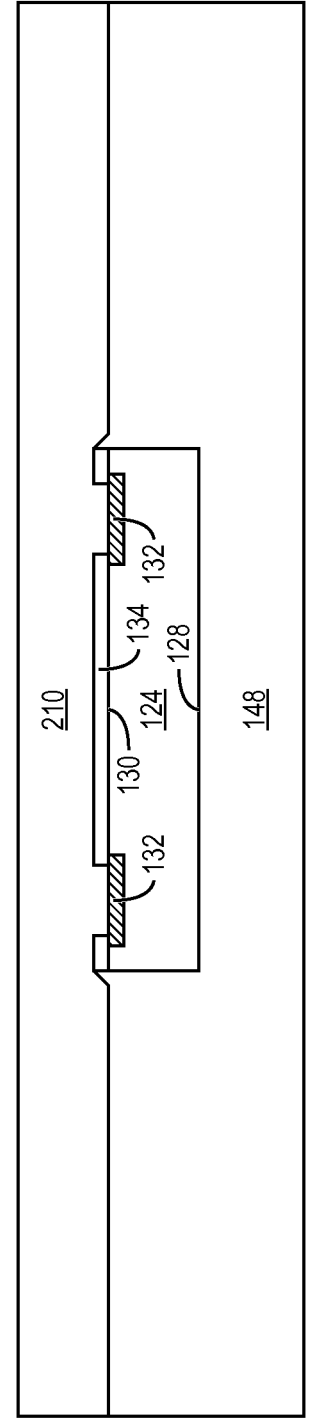
FIG. 8
FIG. 9a

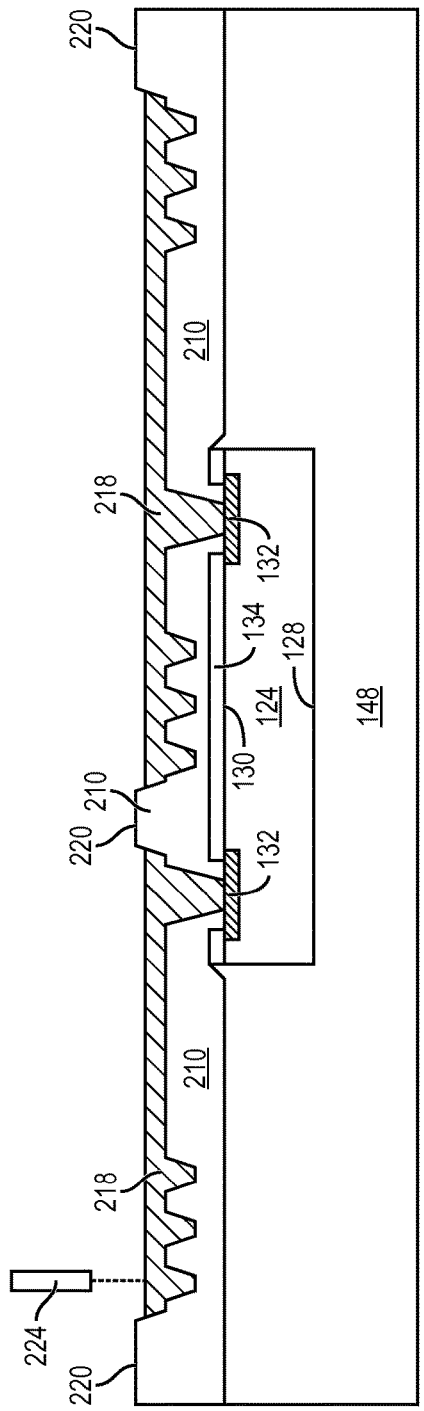
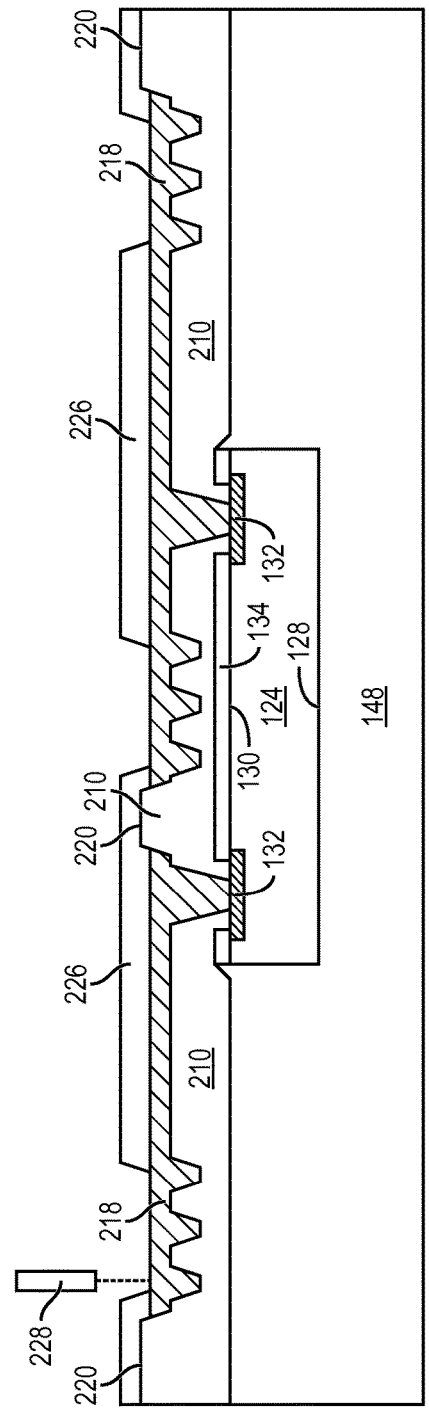

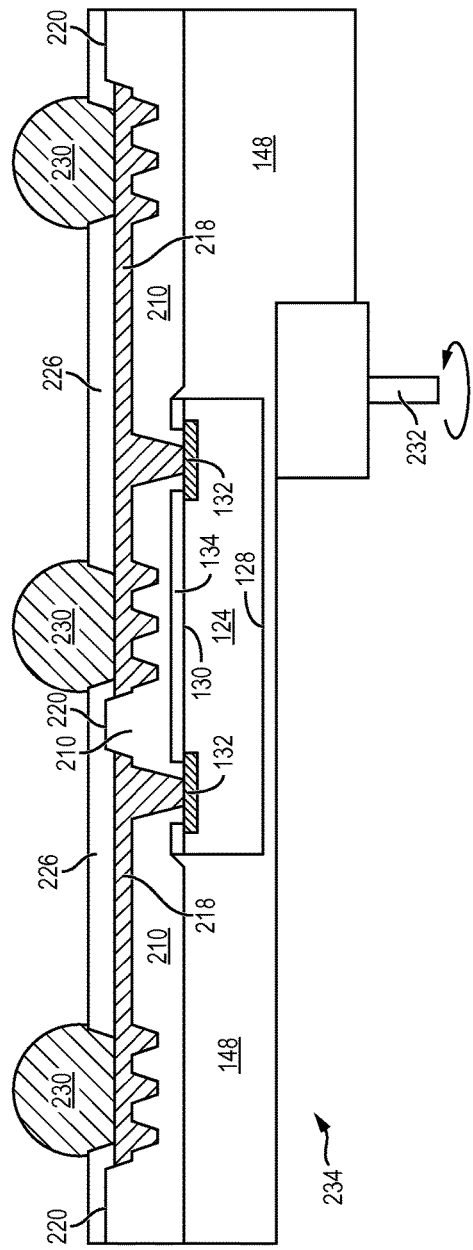
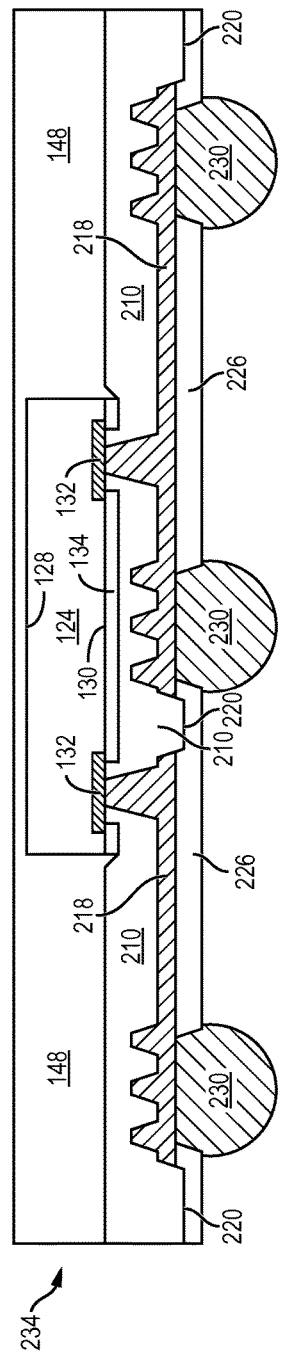
FIG. 9h
FIG. 10

_US 9,607,958 B2_

SEMICONDUCTOR DEVICE AND METHOD FOR FORMING OPENINGS AND TRENCHES IN INSULATING LAYER BY FIRST LDA AND SECOND LDA FOR RDL FORMATION

CLAIM TO DOMESTIC PRIORITY

The present application is a division of U.S. patent application Ser. No. 13/426,561, now U.S. Pat. No. 8,900,929, filed Mar. 21, 2012, which application is incorporated herein by reference.

FIELD OF THE INVENTION

The present invention relates in general to semiconductor devices and, more particularly, to a semiconductor device and method of forming openings and RDL trenches in an insulating layer by first LDA and second LDA for formation of RDL.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A conventional semiconductor die has a plurality of contact pads connected to circuits on the active surface of the die. A first insulating layer is formed over the active surface of the semiconductor die. A portion of the first insulating layer is removed by an etching process through a photoresist layer to expose the contact pads. A conductive layer or redistribution layer (RDL) is formed over the insulating layer and exposed contact pads. A second insulating layer is formed over the conductive layer. A portion of the second insulating layer is removed by an etching process through a photoresist layer to expose the RDL. A plurality of bumps is formed over the exposed RDL.

The photolithography process used to remove portions of the first and second insulating layers adds cost and complexity to the manufacturing process. In addition, the mechanical properties of the first insulating layer and second insulating layer, particularly tensile strength and elongation, must be reduced to be compatible with the photolithography. For example, the tensile strength of the first insulating layer and second insulating layer should be about 50 to 200 MPa and the elongation should be about 5% to 150% for photolithography process.

SUMMARY OF THE INVENTION

A need exists for an insulating layer having good mechanical properties in use with an RDL. Accordingly, in one embodiment, the present invention is a semiconductor device comprising a semiconductor die. An encapsulant is deposited over the semiconductor die. A first insulating layer is formed over the semiconductor die and encapsulant with a trench of the first insulating layer extending from a first opening of the first insulating layer outside the semiconductor die to a second opening of the first insulating layer. A conductive layer is disposed within the trench. A second insulating layer is formed over the conductive layer.

In another embodiment, the present invention is a semiconductor device comprising a semiconductor die. An encapsulant is deposited over the semiconductor die. A first insulating layer is formed over the semiconductor die and encapsulant with a trench of the first insulating layer between a first opening of the first insulating layer outside the semiconductor die and a second opening of the first insulating layer. A conductive layer is formed over the first insulating layer.

In another embodiment, the present invention is a semiconductor device comprising a semiconductor die. A first insulating layer is formed over the semiconductor die with a trench of the first insulating layer between a first opening of the first insulating layer outside the semiconductor die and a second opening of the first insulating layer. A conductive layer is disposed in the trench.

In another embodiment, the present invention is a semiconductor device comprising a semiconductor die. A first insulating layer is formed over the semiconductor die including an opening in the first insulating layer outside the semiconductor die and a trench extending from the opening. A conductive layer is disposed in the trench.

BRIEF DESCRIPTION OF THE DRAWINGS

FIGS. 3a-3c illustrate a process of forming a conductive pillar having a recess on a semiconductor die;

FIGS. 4a-4m illustrate a process of forming openings and RDL trenches in an insulating layer by first LDA and second LDA for formation of an RDL;

FIGS. 7a-7j illustrate a process of forming a compliant layer over the active surface and forming openings and RDL trenches in an insulating layer for formation of an RDL;

FIG. 8 illustrates a semiconductor die with a compliant layer formed over the active surface and RDL formed in openings and RDL trenches of the insulating layer according to FIGS. 7a-7j;

FIGS. 9a-9h illustrate a process of forming openings and RDL trenches in an insulating layer by first LDA and second LDA for formation of an RDL;

FIG. 10 illustrates a semiconductor die with RDL formed in openings and RDL trenches of the insulating layer having high tensile strength and elongation according to FIGS. 9a-9g;

DETAILED DESCRIPTION OF THE DRAWINGS

Figure 1:
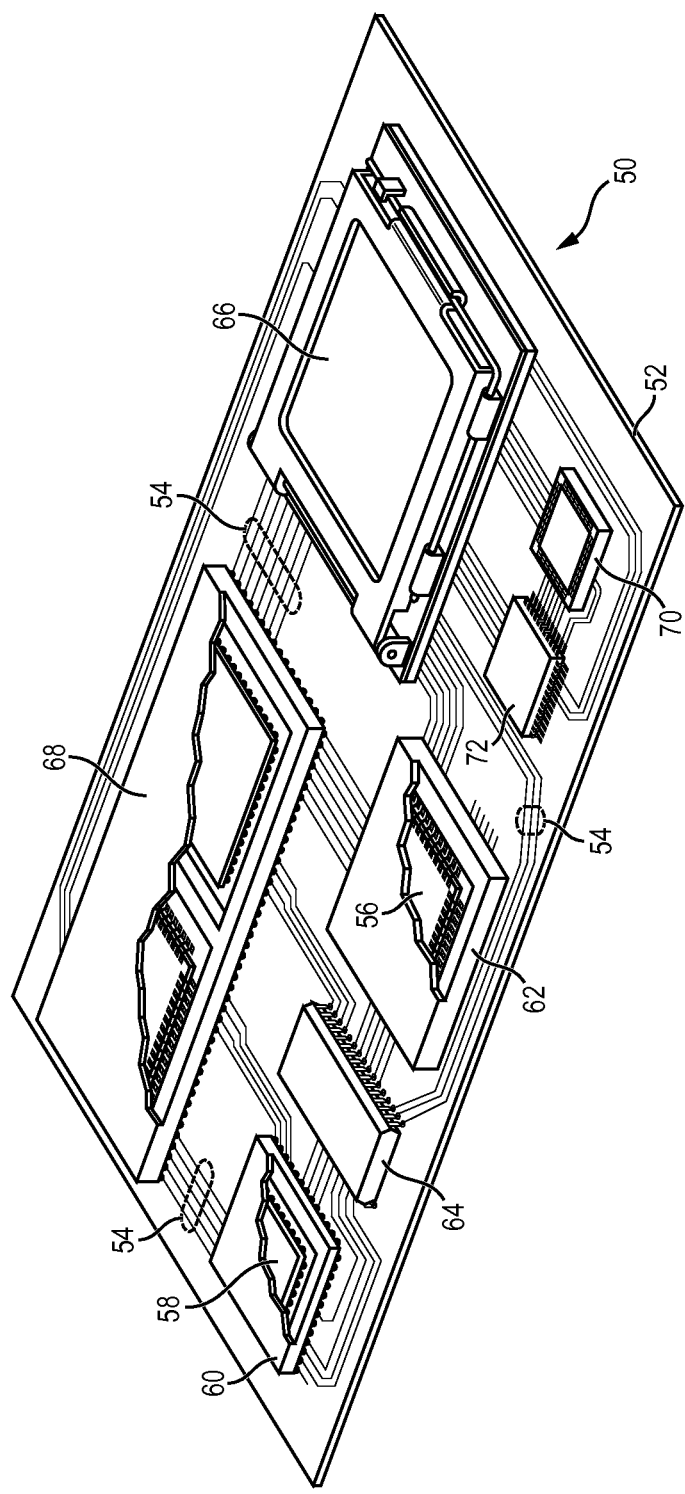
FIG. 1 illustrates a printed circuit board with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
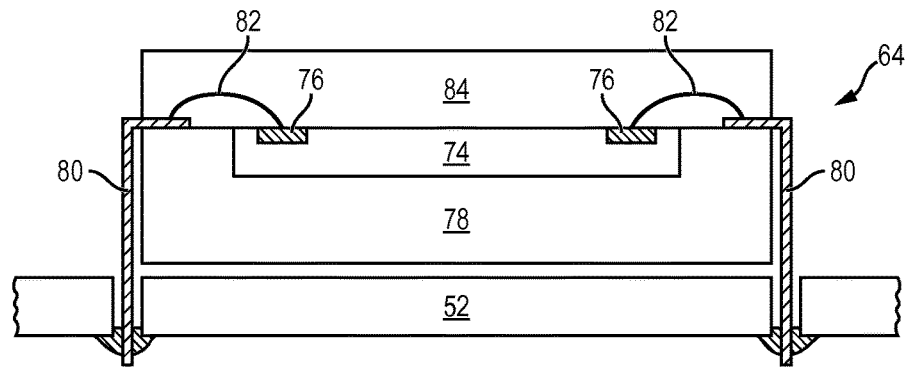
FIGS. 2a-2c illustrate further detail of the representative semiconductor packages mounted to the printed circuit board.
Figure 2B:
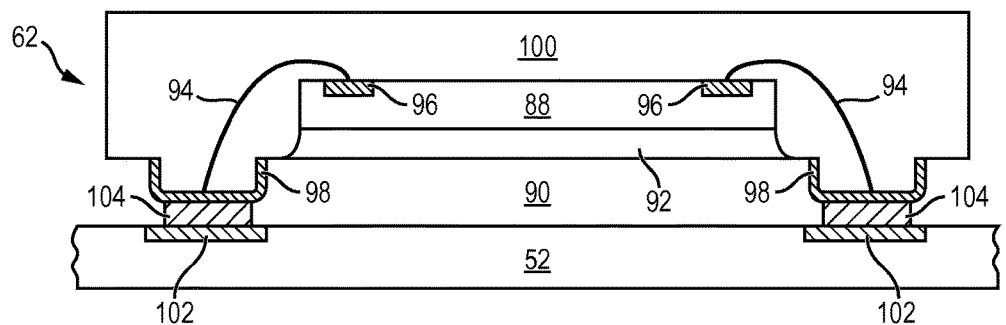
Figure 2C:
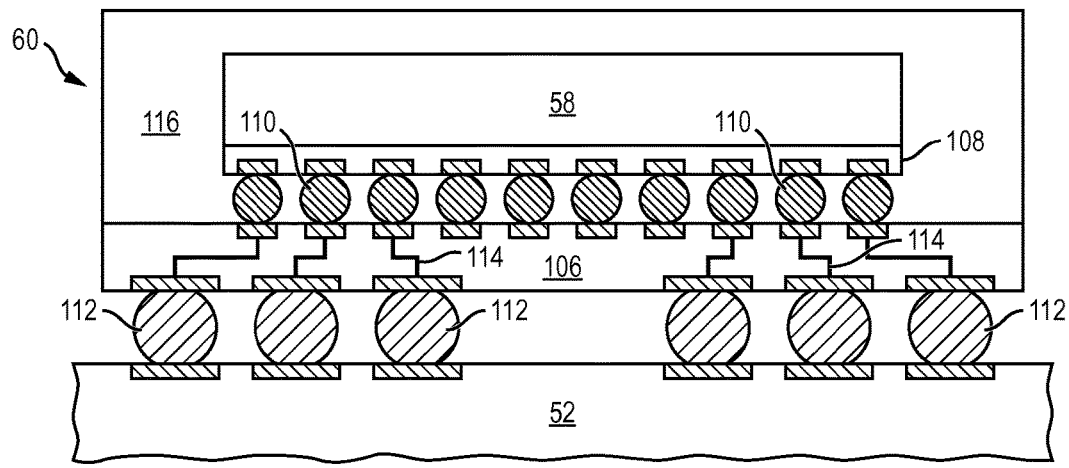

FIGS. 2*a*-2*c* show exemplary semiconductor packages. FIG. 2*a* illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2*b* illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2*c*, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

FIG. 3*a* shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

FIG. 3*b* shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be disposed side-by-side a first distance from the edge of semiconductor die 124, as shown in FIG. 3*b*. Alternatively, conductive layer 132 can be offset in multiple rows such that a first row of contact pads is disposed a first distance from the edge of the die, and a second row of contact pads alternating with the first row is disposed a second distance from the edge of the die.

An insulating or passivation layer 134 is formed over active surface 130 and conductive layer 132 using PVD, CVD, printing, spin coating, spray coating, sintering or thermal oxidation. The insulating layer 134 contains one or more layers of silicon dioxide (SiO2), silicon nitride (Si3N4), silicon oxynitride (SiON), tantalum pentoxide (Ta2O5), aluminum oxide (Al2O3), hafnium oxide (HfO2), benzocyclobutene (BCB), polyimide (PI), polybenzoxazoles (PBO), or other suitable insulating material having similar properties. A portion of insulating layer 134 is removed by an etching process through a patterned photoresist layer to expose conductive layer 132. Alternatively, a portion of insulating layer 134 is removed by laser direct ablation (LDA) using laser 135 to expose conductive layer 132.

In FIG. 3*c*, semiconductor wafer 120 is singulated through insulating layer 134 and saw street 126 with saw blade or laser cutting tool 136 into individual semiconductor die 124.

Figure 4D:
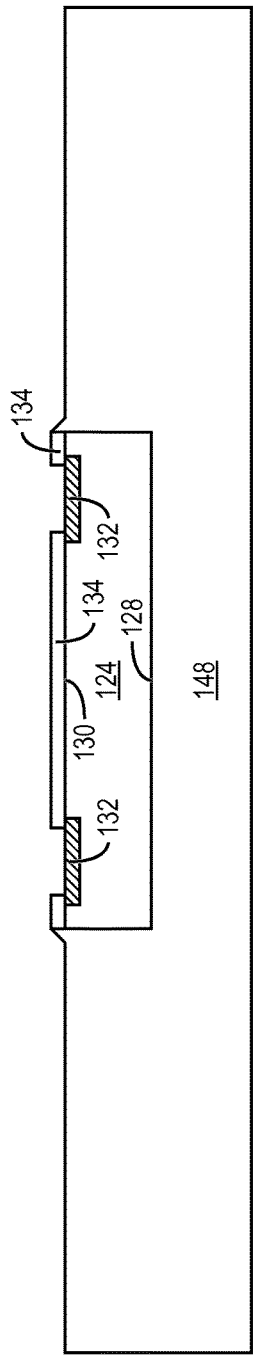

FIGS. 4*a*-4*m* illustrate, in relation to FIGS. 1 and 2*a*-2*c*, a process of forming openings and RDL trenches in an insulating layer by first LDA and second LDA for formation of an RDL. In FIG. 4a, a substrate or carrier 140 contains temporary or sacrificial base material such as silicon, polymer, beryllium oxide, or other suitable low-cost, rigid material for structural support. An interface layer or double-sided tape 142 is formed over carrier 140 as a temporary adhesive bonding film or etch-stop layer. Semiconductor die 124 from FIGS. 3a-3c is positioned over interface layer 142 and carrier 140 using a pick and place operation with insulating layer 134 oriented toward the carrier. FIG. 4b shows semiconductor die 124 mounted to interface layer 142 and carrier 140 as part of a reconstituted or reconfigured wafer level package 144.

In FIG. 4c, an encapsulant or molding compound 148 is deposited over semiconductor die 124 and carrier 140 using a paste printing, compressive molding, transfer molding, liquid encapsulant molding, vacuum lamination, spin coating, or other suitable applicator. Encapsulant 148 can be polymer composite material, such as epoxy resin with filler, epoxy acrylate with filler, or polymer with proper filler. Encapsulant 148 is non-conductive and environmentally protects the semiconductor device from external elements and contaminants.

In FIG. 4d, carrier 140 and interface layer 142 are removed by chemical etching, mechanical peeling, CMP, mechanical grinding, thermal bake, UV light, laser scanning, or wet stripping to expose insulating layer 134 and encapsulant 148. The process of removing carrier 140 and interface layer 142 may also remove a portion of encapsulant 148 outside a footprint of semiconductor die 124 to a level at or below active surface 130.

Figure 4E:
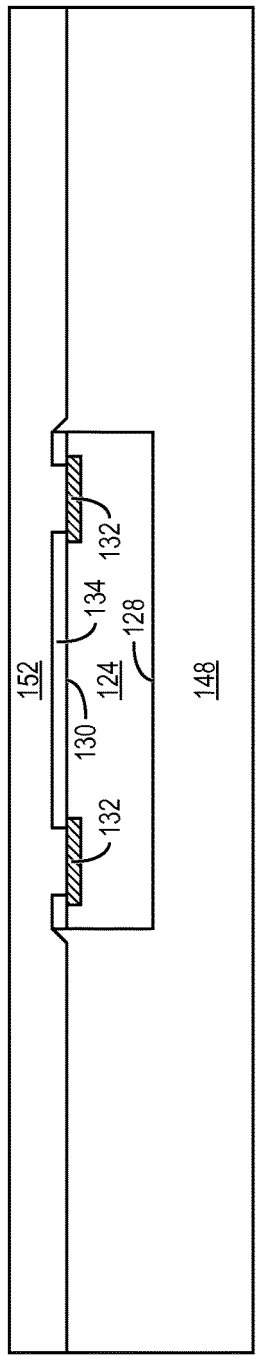

In FIG. 4e, an insulating or passivation layer 152 is formed over insulating layer 134, conductive layer 132, and encapsulant 148 using PVD, CVD, screen printing, spin coating, spray coating, sintering, lamination, or thermal oxidation. The insulating layer 152 contains one or more layers of $SiO_2$, $Si_3N_4$, SiON, $Ta_2O_5$, $Al_2O_3$, $HfO_2$, BCB, PI, PBO, or other suitable insulating material having similar properties. In particular, insulating layer 152 has tensile strength greater than 50 MPa, elongation greater than 40% at room temperature, and elongation greater than 15% at −55° C. The insulating layer 152 is cured at less than 260° C. After cure, the thickness of insulating layer 152 ranges from 14-40 micrometers (μm).

Figure 4F:
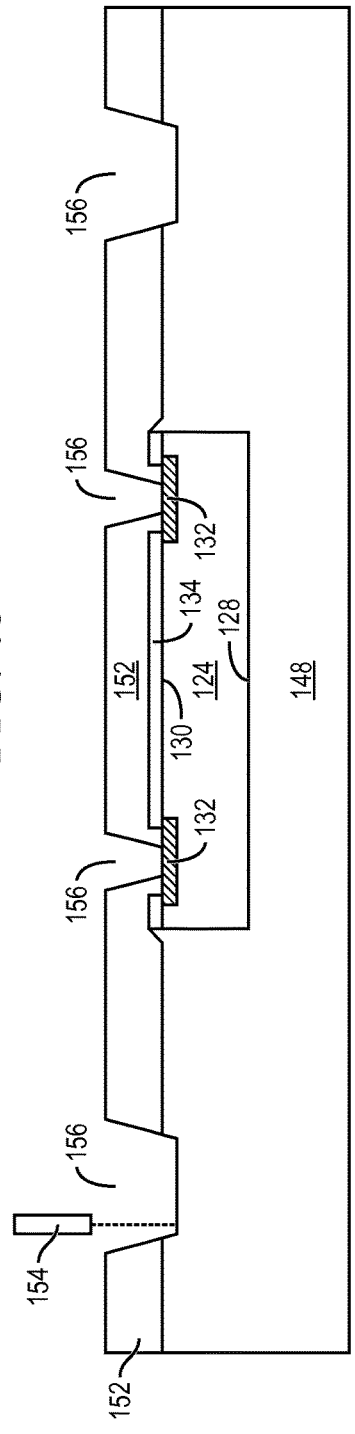
Figure 4G:
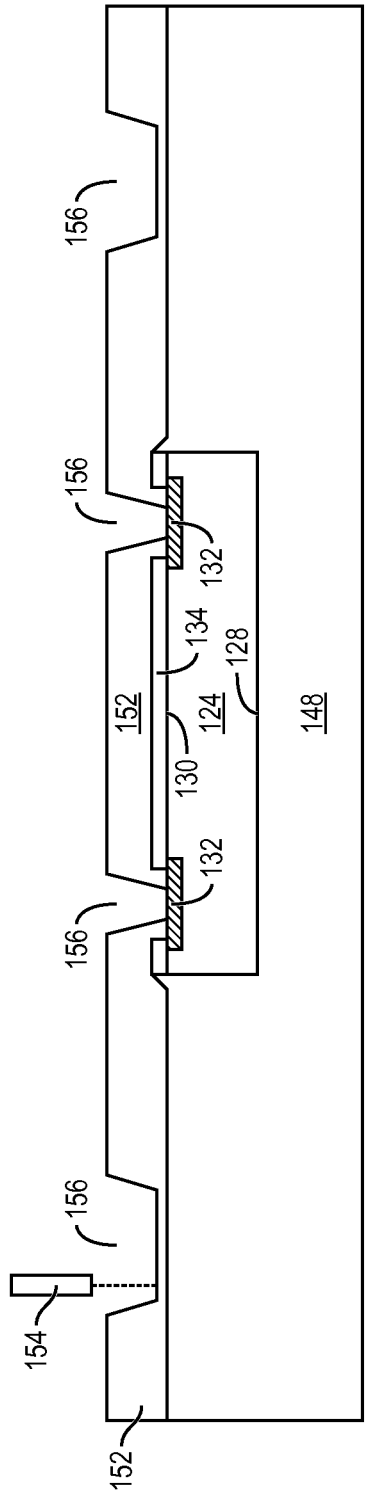

In FIG. 4f, a first portion of insulating layer 152 is removed by a first LDA using laser 154 to form vias or openings 156. Some of the openings 156 expose conductive layer 132. Other openings 156 extend through insulating layer 152 into encapsulant 148. Alternatively, the other openings 156 extend partially through insulating layer 152 and stop short of encapsulant 148, leaving the insulating layer over the encapsulant, as shown in FIG. 4g. Openings 156 have a diameter of 15-60 μm.

Figure 4H:
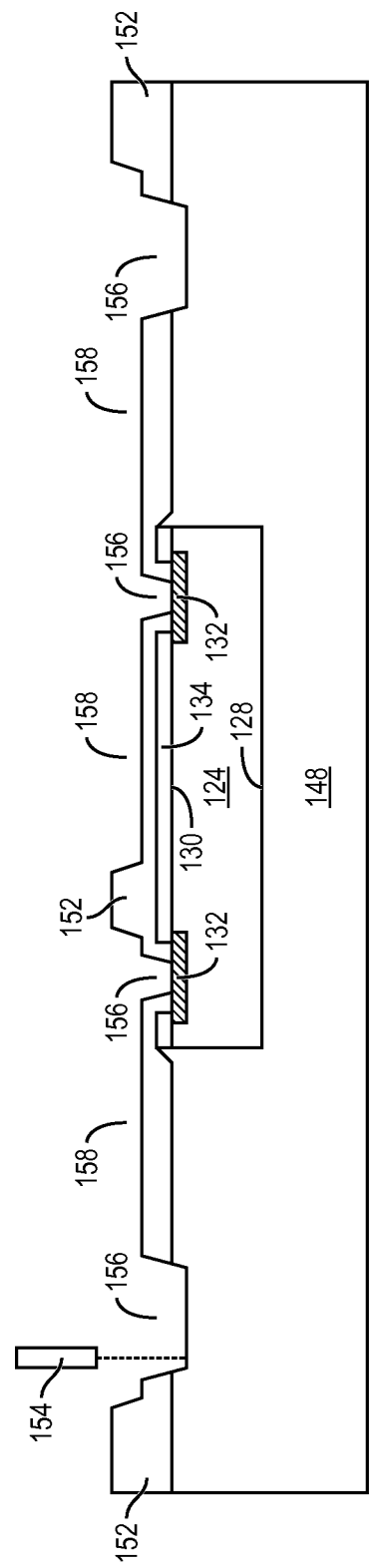

Continuing from FIG. 4f, a second portion of insulating layer 152 is removed by a second LDA using laser 154 to form redistribution layer (RDL) trenches or channels 158, as shown in FIG. 4h. In one embodiment RDL trenches 158 have a depth of 4 μm. FIG. 4i shows a plan view of openings 156 and RDL trenches 158 formed in insulating layer 152. A wet cleaning is applied to remove stray particles and debris.

In FIG. 4j, an electrically conductive layer 160 is formed within openings 156 and RDL trenches 158 using an evaporation, electrolytic plating, electroless plating, or screen printing process. Conductive layer 160 can be one or more layers of Al, Cu, Sn, Ni, Au, Ag, or other suitable electrically conductive material. In one embodiment, conductive layer 160 includes a seed layer containing Ti/Cu or TiW/Cu and a blanket Cu plated layer extending above surface 164 of insulating layer 152. The plating process and ratio of alloys are controlled to achieve bottom-up plating, while maintaining surface 162 planar and minimizing the thickness of conductive layer 160 above surface 164 of insulating layer 152. For example, a step plating applies a pulse plating, followed by low current density DC plating, and high current density (>2.5 ASD) DC plating.

In FIG. 4k, a portion of conductive layer 160 is removed, e.g., by blanket wet etch, to reduce the thickness of the conductive layer below surface 164 of insulating layer 152. Alternatively, a portion of conductive layer 160 is removed by wet chemical etch followed by LDA using laser 165 or plasma dry etch to reduce the thickness of the conductive layer below surface 164 of insulating layer 152. Conductive layer 160 is annealed at less than 260° C., followed by wet cleaning.

In FIG. 4l, an insulating or passivation layer 166 is formed over insulating layer 152 and conductive layer 160 using PVD, CVD, screen printing, spin coating, spray coating, sintering, lamination, or thermal oxidation. The insulating layer 166 contains one or more layers of $SiO_2$, $Si_3N_4$, SiON, $Ta_2O_5$, $Al_2O_3$, $HfO_2$, BCB, PI, PBO, or other suitable insulating material having similar properties. In particular, insulating layer 166 has tensile strength greater than 50 MPa, elongation greater than 40% at room temperature, and elongation greater than 15% at −55° C. A portion of insulating layer 166 is removed by LDA using laser 168 to expose conductive layer 160. The insulating layer 166 is cured at less than 260° C. After cure, the thickness of insulating layer 166 is about 5 μm.

Figure 4M:
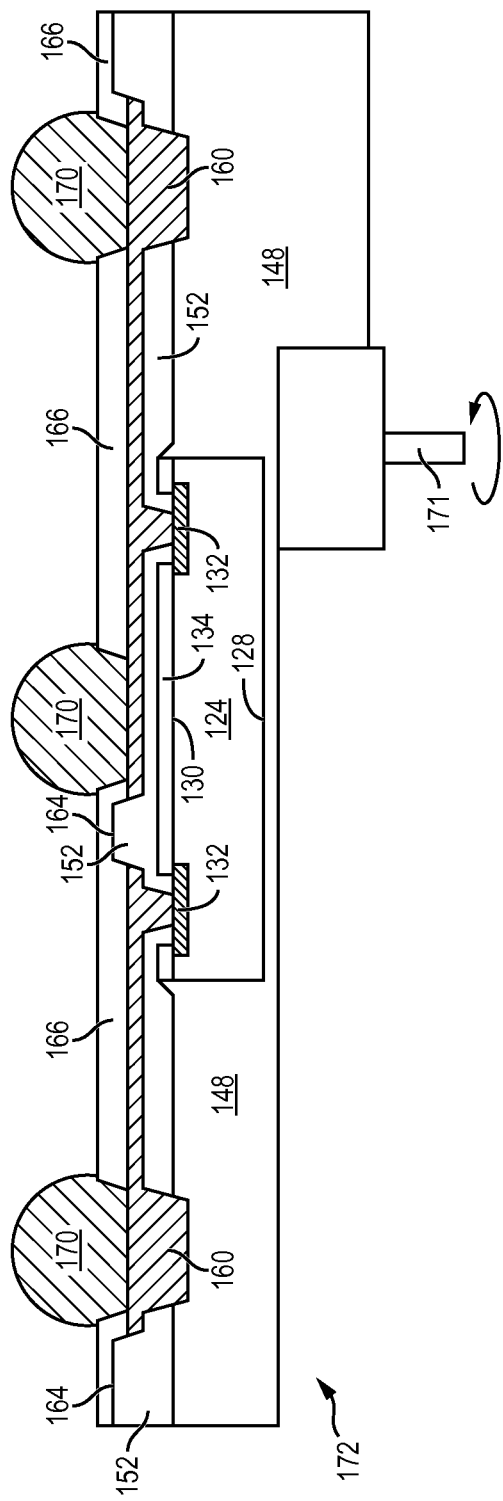

In FIG. 4m, an electrically conductive bump material is deposited over the exposed conductive layer 160 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 160 using a suitable attachment or bonding process. In one embodiment, the bump material is reflowed by heating the material above its melting point to form balls or bumps 170. In some applications, bumps 170 are reflowed a second time to improve electrical contact to conductive layer 160. Bumps 170 can also be compression bonded to conductive layer 160. Bumps 170 represent one type of interconnect structure that can be formed over conductive layer 160. The interconnect structure can also use stud bumps, micro bumps, or other electrical interconnect.

A portion of encapsulant 148 is removed by grinder 171 to planarize and reduce the package thickness. The reconstituted semiconductor wafer 144 is singulated through encapsulant 148 into individual Fo-WLCSP 172.

Figure 5:
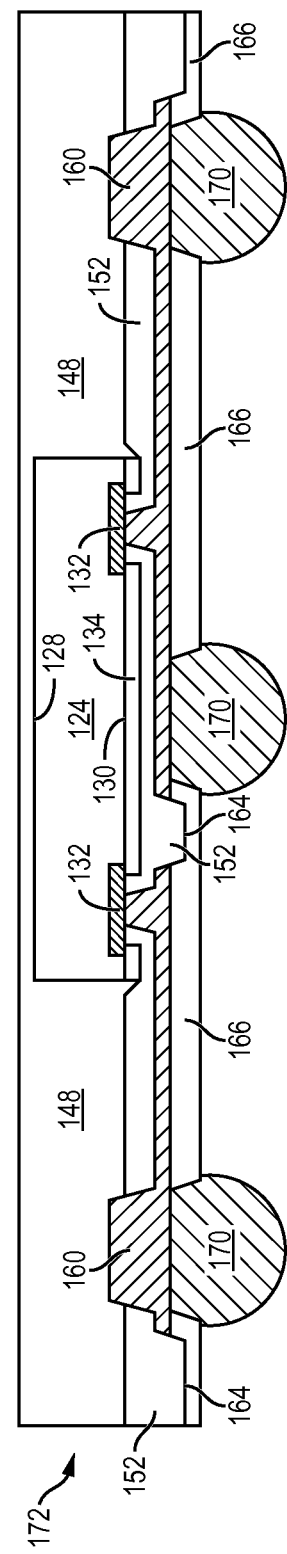
FIG. 5 illustrates a semiconductor die with RDL formed in the openings and RDL trenches of the insulating layer having high tensile strength and elongation according to FIGS. 4a-4m.

FIG. 5 shows Fo-WLCSP 172 after singulation. Semiconductor die 124 is electrically connected through conductive layer 160 to bumps 170. The insulating layer 152 receives a first LDA to form openings 156, followed by a second LDA to form RDL trenches 158 in the insulating layer for conductive layer 160. Openings 156 may extend through insulating layer 152 into encapsulant 148, or partially through insulating layer 152 and stop short of the encapsulant leaving the insulating layer over the encapsulant. The first LDA and second LDA allow for the use of insulating layer 166 having good mechanical properties, such as tensile strength greater than 50 MPa, elongation greater than 40% at room temperature, and elongation greater than 15% at −55° C. Conductive layer 160 is formed within openings 156 and RDL trenches 158 of insulating layer 152. When formed, conductive layer 160 extends above surface 164 of insulating layer 152. The thickness of conductive layer 160 is reduced to a level below surface 164 of insulating layer 152.

Figure 6A:
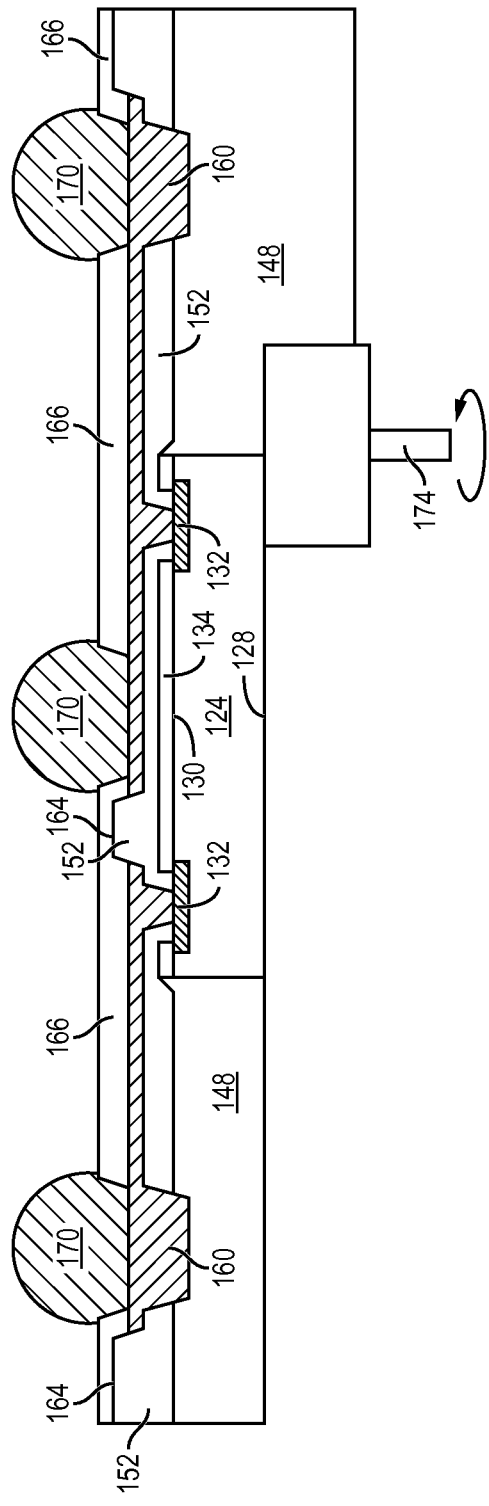
FIGS. 6a-6b illustrate forming vias through the encapsulant to the RDL.
Figure 6B:
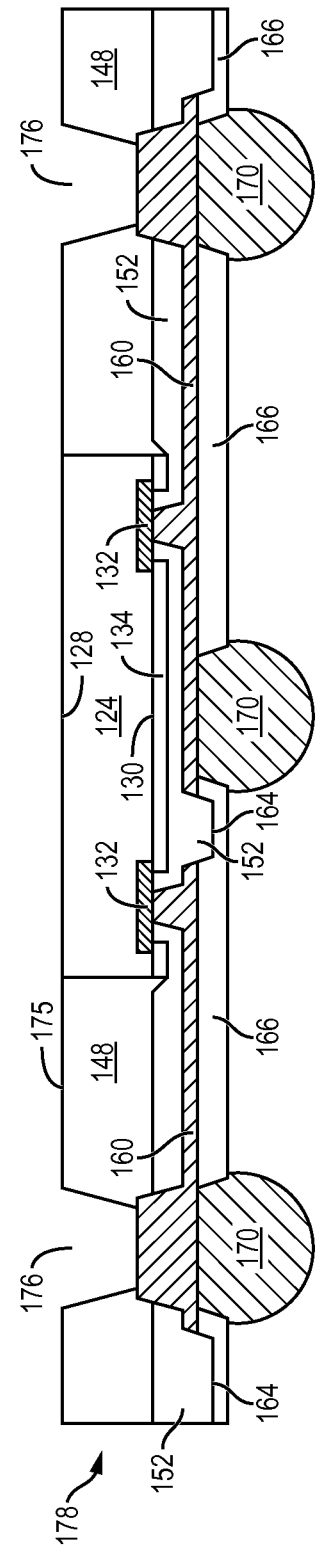

In another embodiment, continuing from FIG. 4m, a portion of encapsulant 148 is removed by grinder 174 to planarize and reduce thickness of the Fo-WLCSP, as shown in FIG. 6a. In FIG. 6b, a portion of encapsulant 148 is removed from surface 175 to form openings 176 and expose conductive layer 160. The reconstituted semiconductor wafer 144 is singulated through encapsulant 148 into individual Fo-WLCSP 178.

Figure 7E:
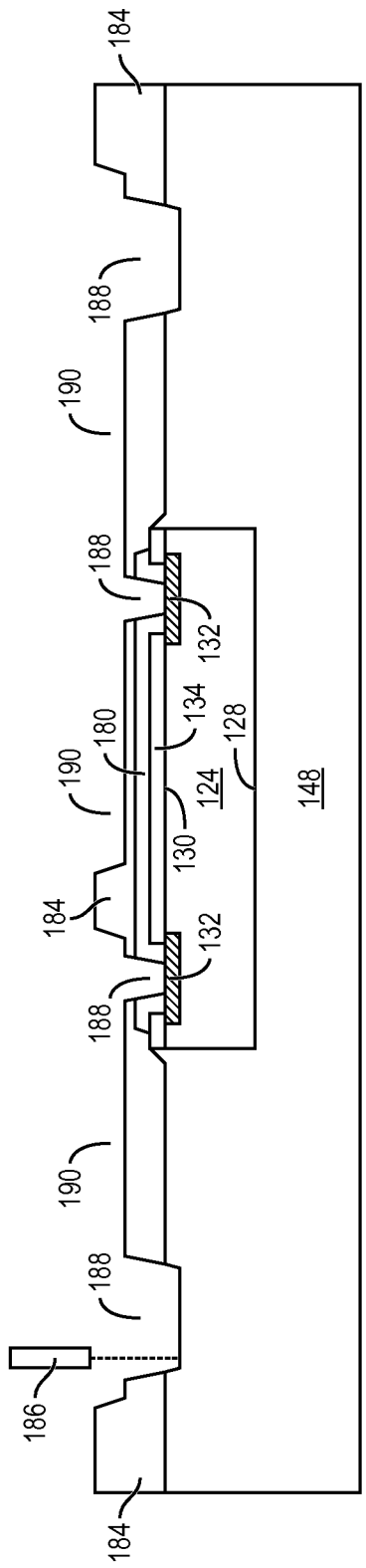

FIGS. 7a-7j illustrate, in relation to FIGS. 1 and 2a-2c, a process of forming a compliant layer over the active surface and further forming openings and RDL trenches in an insulating layer for an RDL. Continuing from FIG. 4d, an insulating or passivation layer 180 is formed over insulating layer 134 and conductive layer 132 using PVD, CVD, screen printing, spin coating, spray coating, sintering, lamination, or thermal oxidation, as shown in FIG. 7a. The insulating layer 180 contains one or more layers of SiO2, Si3N4, SiON, Ta2O5, Al2O3, HfO2, BCB, PI, PBO, or other suitable insulating material having similar properties. In one embodiment, insulating layer 180 contains a compliant material, such as PI or PBO, for stress relief. A portion of insulating layer 180 is removed by LDA using laser 182 to expose conductive layer 132. Alternatively, insulating layer 180 is formed over semiconductor wafer 120 prior to singulation, see FIG. 3b.

In FIG. 7b, an insulating or passivation layer 184 is formed over encapsulant 148, insulating layer 180, and conductive layer 132 using PVD, CVD, screen printing, spin coating, spray coating, sintering, lamination, or thermal oxidation. The insulating layer 184 contains one or more layers of SiO2, Si3N4, SiON, Ta2O5, Al2O3, HfO2, BCB, PI, PBO, or other suitable insulating material having similar properties. In particular, insulating layer 184 has tensile strength greater than 50 MPa, elongation greater than 40% at room temperature, and elongation greater than 15% at −55° C. The insulating layer 184 is cured at less than 260° C. After cure, the thickness of insulating layer 184 ranges from 14-40 μm.

In FIG. 7c, a first portion of insulating layer 184 is removed by a first LDA using laser 186 to form vias or openings 188. Some of the openings 188 expose conductive layer 132. Other openings 188 extend through insulating layer 184 into encapsulant 148. Alternatively, the other openings 188 extend partially through insulating layer 184 and stop short of encapsulant 148, leaving the insulating layer over the encapsulant, as shown in FIG. 7d. Openings 188 have a diameter of 15-60 μm.

Figure 7F:
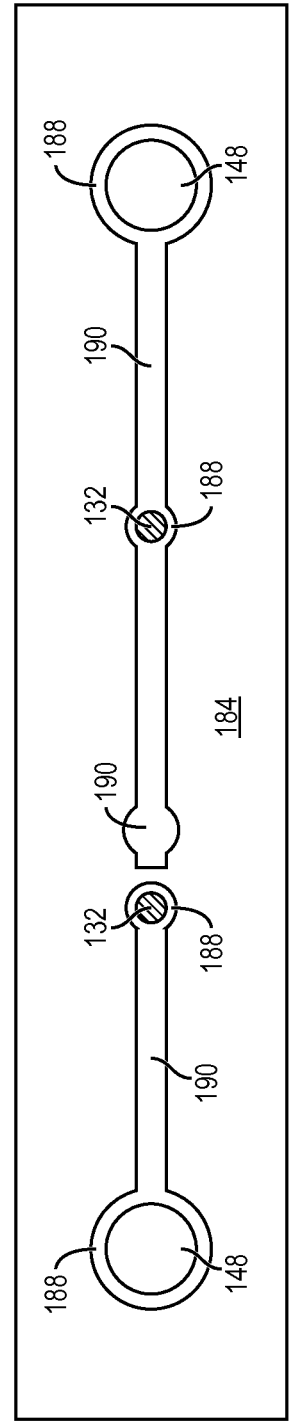

Continuing from FIG. 7c, a second portion of insulating layer 184 is removed by a second LDA using laser 186 to form RDL trenches or channels 190, as shown in FIG. 7e. In one embodiment RDL trenches 190 have a depth of 4 μm. FIG. 7f shows a plan view of openings 188 and RDL trenches 190 formed in insulating layer 184. A wet cleaning is applied to remove stray particles and debris.

Figure 7G:
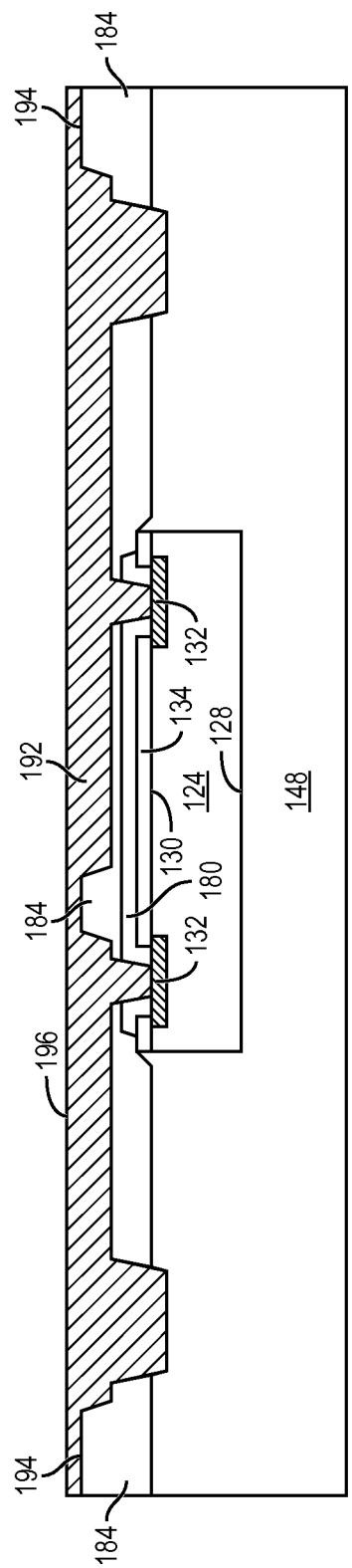

In FIG. 7g, an electrically conductive layer 192 is formed within openings 188 and RDL trenches 190 using an evaporation, electrolytic plating, electroless plating, or screen printing process. Conductive layer 192 can be one or more layers of Al, Cu, Sn, Ni, Au, Ag, or other suitable electrically conductive material. In one embodiment, conductive layer 192 includes a seed layer containing Ti/Cu or TiW/Cu and a blanket Cu plated layer extending above surface 194 of insulating layer 184. The plating process and ratio of alloys are controlled to achieve bottom-up plating, while maintaining surface 196 planar and minimizing the thickness of conductive layer 192 above surface 194 of insulating layer 184. For example, a step plating applies a pulse plating, followed by low current density DC plating, and high current density (>2.5 ASD) DC plating.

Figure 7H:
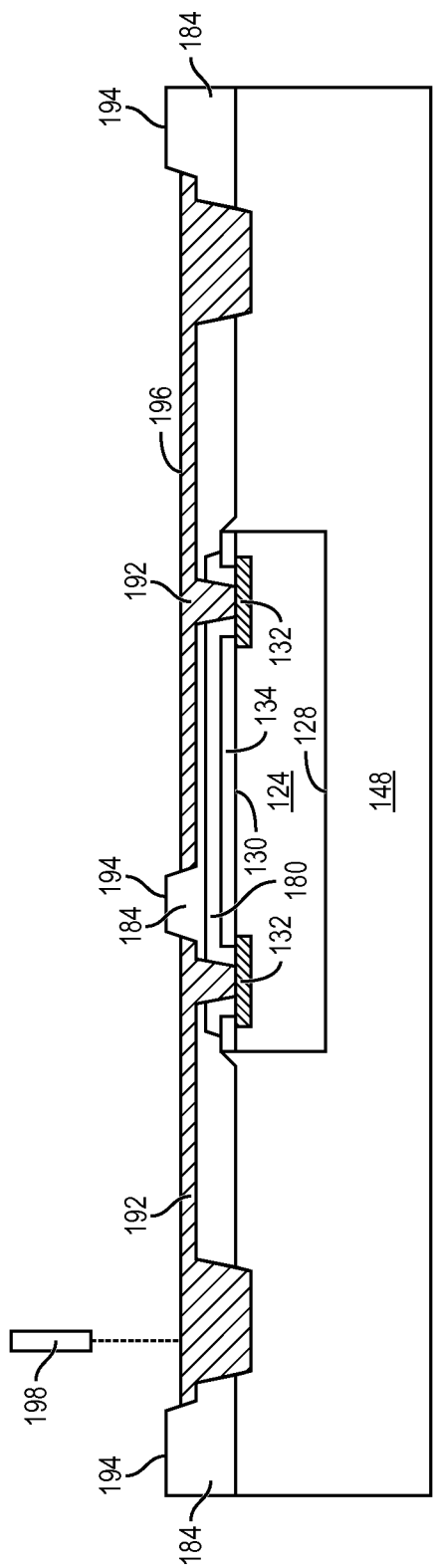

In FIG. 7h, a portion of conductive layer 192 is removed, e.g., by blanket wet etch, to reduce the thickness of the conductive layer below surface 194 of insulating layer 184. Alternatively, a portion of conductive layer 192 is removed by wet chemical etch followed by LDA using laser 198 or plasma dry etch to reduce the thickness of the conductive layer below surface 194 of insulating layer 184. Conductive layer 192 is annealed at less than 260° C., followed by wet cleaning.

Figure 7I:
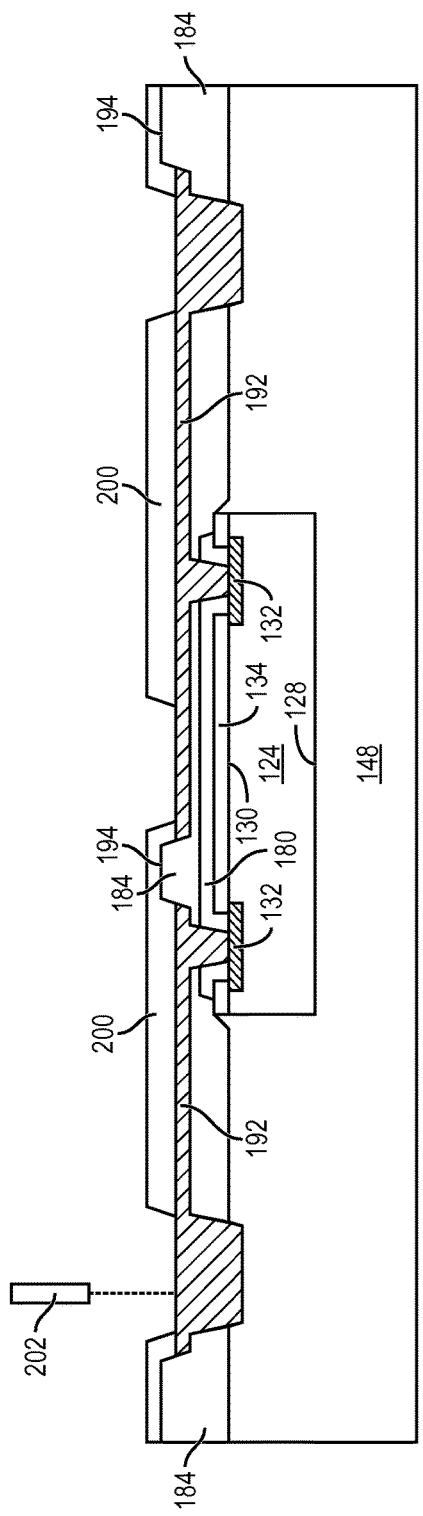

In FIG. 7i, an insulating or passivation layer 200 is formed over insulating layer 184 and conductive layer 192 using PVD, CVD, screen printing, spin coating, spray coating, sintering, lamination, or thermal oxidation. The insulating layer 200 contains one or more layers of SiO2, Si3N4, SiON, Ta2O5, Al2O3, HfO2, BCB, PI, PBO, or other suitable insulating material having similar properties. In particular, insulating layer 200 has tensile strength greater than 50 MPa, elongation greater than 40% at room temperature, and elongation greater than 15% at −55° C. A portion of insulating layer 200 is removed by LDA using laser 202 to expose conductive layer 192. The insulating layer 200 is cured at less than 260° C. After cure, the thickness of insulating layer 200 is about 5 μm.

Figure 7J:
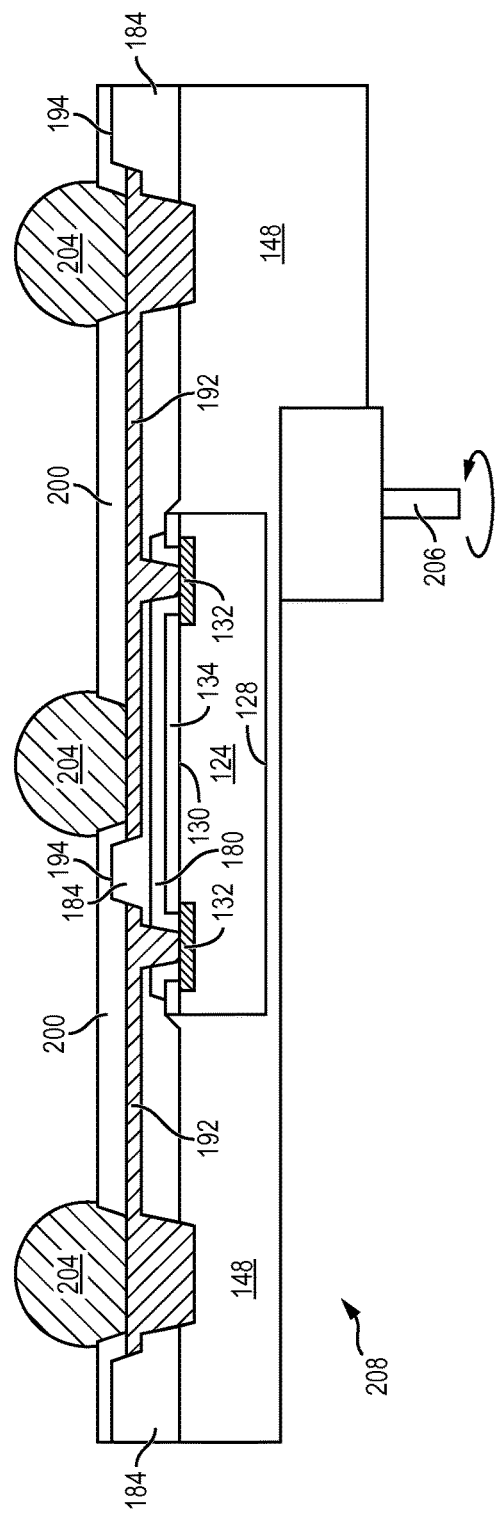

In FIG. 7j, an electrically conductive bump material is deposited over the exposed conductive layer 192 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 192 using a suitable attachment or bonding process. In one embodiment, the bump material is reflowed by heating the material above its melting point to form balls or bumps 204. In some applications, bumps 204 are reflowed a second time to improve electrical contact to conductive layer 192. Bumps 204 can also be compression bonded to conductive layer 192. Bumps 204 represent one type of interconnect structure that can be formed over conductive layer 192. The interconnect structure can also use stud bumps, micro bumps, or other electrical interconnect.

A portion of encapsulant 148 is removed by grinder 206 to planarize and reduce the package thickness. The reconstituted semiconductor wafer 144 is singulated through encapsulant 148 into individual Fo-WLCSP 208.

FIG. 8 shows Fo-WLCSP 208 after singulation. Semiconductor die 124 is electrically connected through conductive layer 192 to bumps 204. The insulating layer 184 receives a first LDA to form openings 188, followed by a second LDA to form RDL trenches 190 in the insulating layer for conductive layer 192. Openings 188 may extend through insulating layer 184 into encapsulant 148, or partially through insulating layer 184 and stop short of the encapsulant leaving the insulating layer over the encapsulant. The first LDA and second LDA allow for the use of insulating layer 184 having good mechanical properties, such as tensile strength greater than 50 MPa, elongation greater than 40% at room temperature, and elongation greater than 15% at −55° C. Conductive layer 192 is formed within openings 188 and RDL trenches 190 of insulating layer 184. When formed, conductive layer 192 extends above surface 194 of insulating layer 184. The thickness of conductive layer 192 is reduced to a level below surface 194 of insulating layer 184.

Figure 9B:
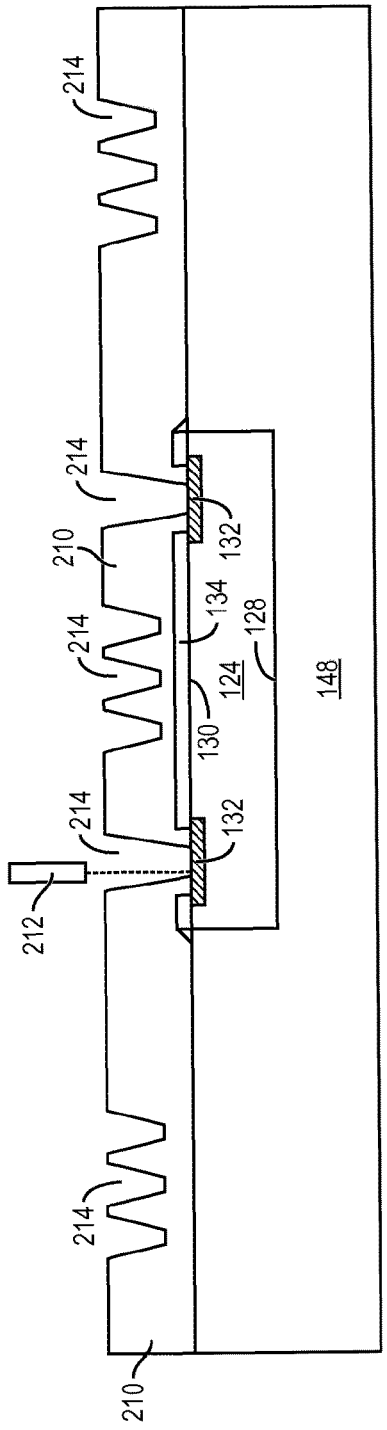

FIGS. 9a-9h illustrate, in relation to FIGS. 1 and 2a-2c, forming openings and RDL trenches in an insulating layer by first LDA and second LDA for formation of an RDL. Continuing from FIG. 4d, an insulating or passivation layer 210 is formed over insulating layer 134, conductive layer 132, and encapsulant 148 using PVD, CVD, screen printing, spin coating, spray coating, sintering, lamination, or thermal oxidation, as shown in FIG. 9a. The insulating layer 210 contains one or more layers of SiO2, Si3N4, SiON, Ta2O5, Al2O3, HfO2, BCB, PI, PBO, or other suitable insulating material having similar properties. In particular, insulating layer 210 has tensile strength greater than 50 MPa, elongation greater than 40% at room temperature, and elongation greater than 15% at −55° C. The insulating layer 210 is cured at less than 260° C. After cure, the thickness of insulating layer 210 ranges from 14-40 μm.

Figure 9C:
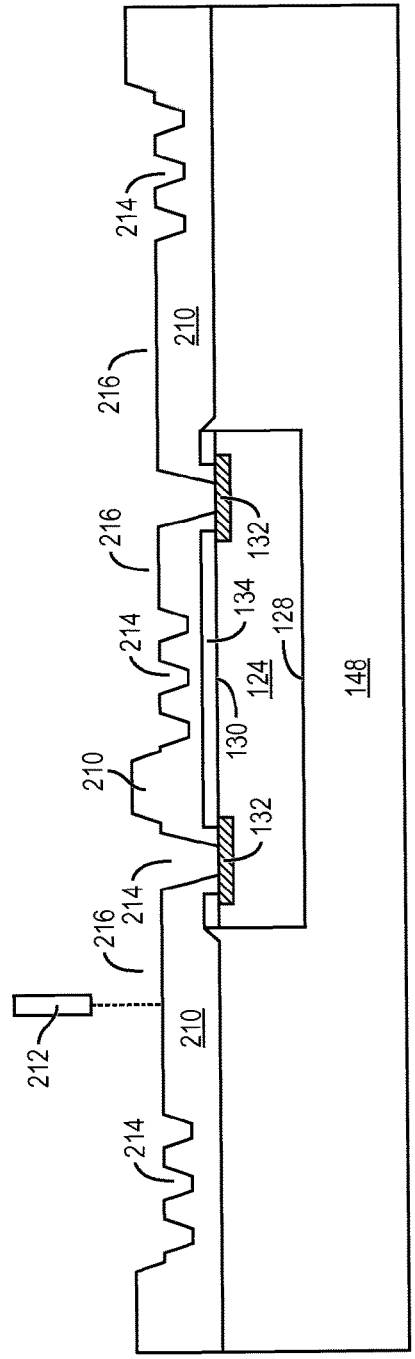
Figure 9D:
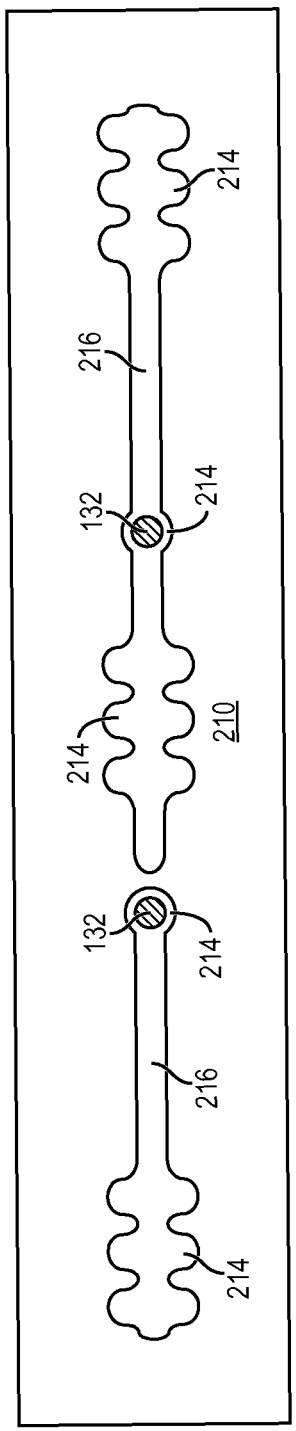

In FIG. 9b, a first portion of insulating layer 210 is removed by a first LDA using laser 212 to form vias or openings 214. Some of the openings 214 expose conductive layer 132. Other openings 214 extend partially through insulating layer 210 and stop short of encapsulant 148, leaving about 2 μm of the insulating layer over the encapsulant. Openings 214 have a diameter of 15-60 μm. A second portion of insulating layer 210 is removed by a second LDA using laser 212 to form RDL trenches or channels 216, as shown in FIG. 9c. FIG. 9d shows a plan view of openings 214 and RDL trenches 216 formed in insulating layer 210.

Figure 9E:
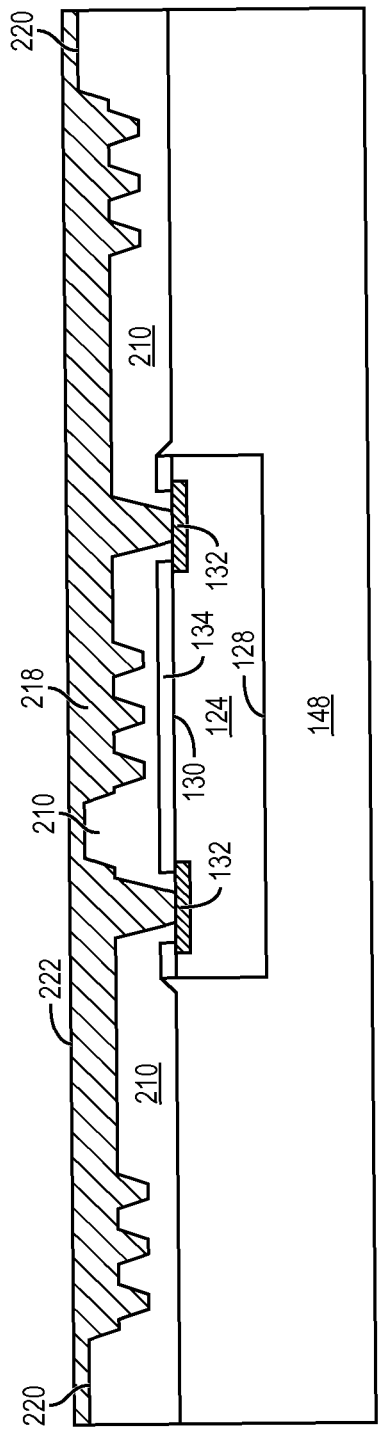

In FIG. 9e, an electrically conductive layer 218 is formed within openings 214 and RDL trenches 216 using an evaporation, electrolytic plating, electroless plating, or screen printing process. Conductive layer 218 can be one or more layers of Al, Cu, Sn, Ni, Au, Ag, or other suitable electrically conductive material. In one embodiment, conductive layer 218 includes a seed layer containing Ti/Cu or TiW/Cu and a blanket Cu plated layer extending above surface 220 of insulating layer 210. The plating process and ratio of alloys are controlled to achieve bottom-up plating, while maintaining surface 222 planar and minimizing the thickness of conductive layer 210 above surface 220 of insulating layer 210. For example, a step plating applies a pulse plating, followed by low current density DC plating, and high current density (>2.5 ASD) DC plating.

In FIG. 9f, a portion of conductive layer 218 is removed, e.g., by blanket wet etch, to reduce the thickness of the conductive layer below surface 220 of insulating layer 210. Alternatively, a portion of conductive layer 218 is removed by wet chemical etch followed by LDA using laser 224 or plasma dry etch to reduce the thickness of the conductive layer below surface 220 of insulating layer 210. Conductive layer 218 is annealed at less than 260° C., followed by wet cleaning.

In FIG. 9g, an insulating or passivation layer 226 is formed over insulating layer 210 and conductive layer 218 using PVD, CVD, screen printing, spin coating, spray coating, sintering, lamination, or thermal oxidation. The insulating layer 226 contains one or more layers of SiO2, Si3N4, SiON, Ta2O5, Al2O3, HfO2, BCB, PI, PBO, or other suitable insulating material having similar properties. In particular, insulating layer 226 has tensile strength greater than 50 MPa, elongation greater than 40% at room temperature, and elongation greater than 15% at −55° C. A portion of insulating layer 226 is removed by LDA using laser 228 to expose conductive layer 218. The insulating layer 226 is cured at less than 260° C. After cure, the thickness of insulating layer 226 is about 5 μm.

In FIG. 9h, an electrically conductive bump material is deposited over the exposed conductive layer 218 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 218 using a suitable attachment or bonding process. In one embodiment, the bump material is reflowed by heating the material above its melting point to form balls or bumps 230. In some applications, bumps 230 are reflowed a second time to improve electrical contact to conductive layer 218. Bumps 230 can also be compression bonded to conductive layer 218. Bumps 230 represent one type of interconnect structure that can be formed over conductive layer 218. The interconnect structure can also use stud bumps, micro bumps, or other electrical interconnect.

A portion of encapsulant 148 is removed by grinder 232 to planarize and reduce the package thickness. The reconstituted semiconductor wafer 144 is singulated through encapsulant 148 into individual Fo-WLCSP 234.

FIG. 10 shows Fo-WLCSP 234 after singulation. Semiconductor die 124 is electrically connected through conductive layer 218 to bumps 230. The insulating layer 210 receives a first LDA to form openings 214, followed by a second LDA to form RDL trenches 216 in the insulating layer for conductive layer 210. The first LDA and second LDA allow for the use of insulating layer 210 having good mechanical properties, such as tensile strength greater than 50 MPa, elongation greater than 40% at room temperature, and elongation greater than 15% at −55° C. Conductive layer 218 is formed within openings 214 and RDL trenches 216 of insulating layer 210. When formed, conductive layer 218 extends above surface 220 of insulating layer 210. The thickness of conductive layer 218 is reduced to a level below surface 220 of insulating layer 210.

Figure 11A:
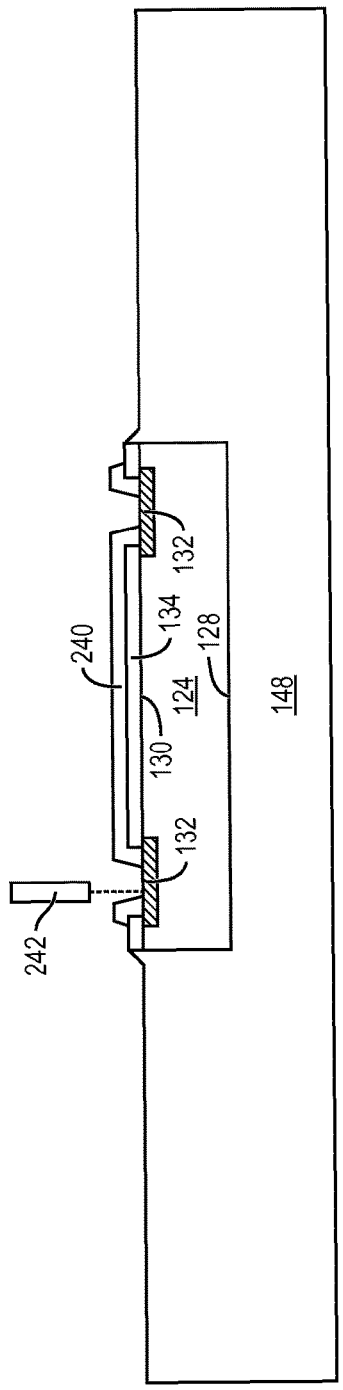
FIGS. 11a-11h illustrate a process of forming a compliant layer over the active surface and forming openings and RDL trenches in an insulating layer for formation of an RDL.

FIGS. 11a-11h illustrate, in relation to FIGS. 1 and 2a-2c, a process of forming a compliant layer over the active surface and further forming openings and RDL trenches in an insulating layer for formation of an RDL. Continuing from FIG. 4d, an insulating or passivation layer 240 is formed over insulating layer 134 and conductive layer 132 using PVD, CVD, screen printing, spin coating, spray coating, sintering, lamination, or thermal oxidation, as shown in FIG. 11a. The insulating layer 240 contains one or more layers of SiO2, Si3N4, SiON, Ta2O5, Al2O3, HfO2, BCB, PI, PBO, or other suitable insulating material having similar properties. In one embodiment, insulating layer 240 contains a compliant material, such as PI or PBO, for stress relief. A portion of insulating layer 240 is removed by LDA using laser 242 to expose conductive layer 132. Alternatively, insulating layer 240 is formed over semiconductor wafer 120 prior to singulation, see FIG. 3b.

Figure 11B:
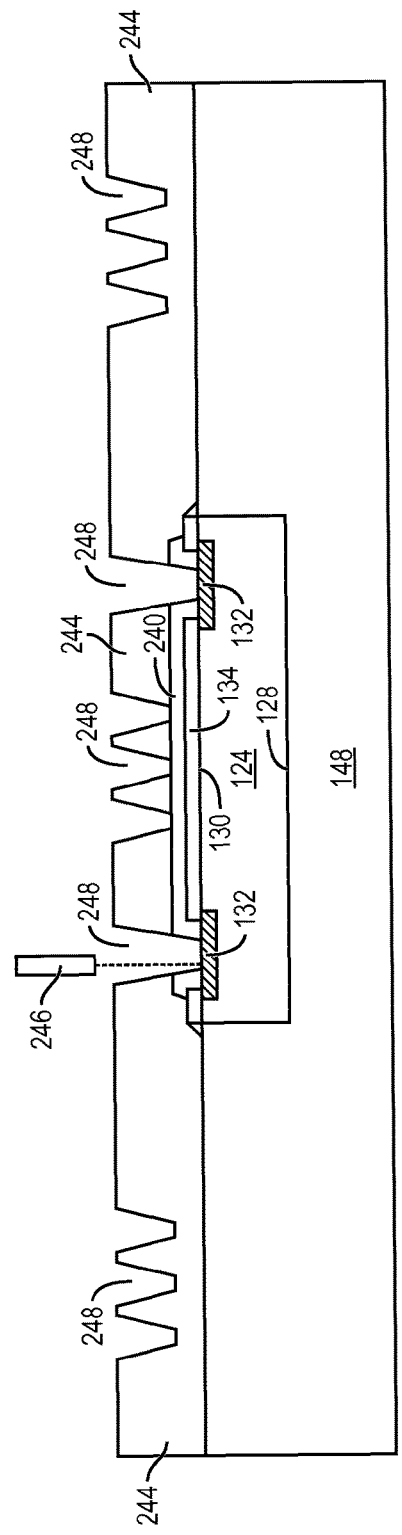

In FIG. 11b, an insulating or passivation layer 244 is formed over insulating layer 240, conductive layer 132, and encapsulant 148 using PVD, CVD, screen printing, spin coating, spray coating, sintering, lamination, or thermal oxidation. The insulating layer 244 contains one or more layers of SiO2, Si3N4, SiON, Ta2O5, Al2O3, HfO2, BCB, PI, PBO, or other suitable insulating material having similar properties. In particular, insulating layer 244 has tensile strength greater than 50 MPa, elongation greater than 40% at room temperature, and elongation greater than 15% at −55° C. The insulating layer 244 is cured at less than 260° C. After cure, the thickness of insulating layer 244 ranges from 14-40 μm.

Figure 11C:
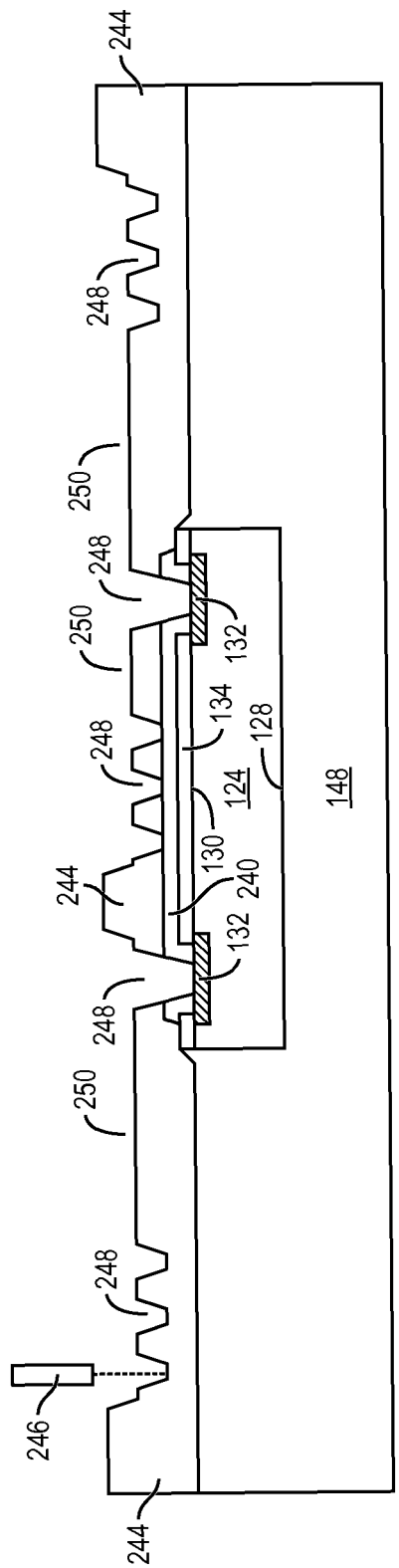
Figure 11D:
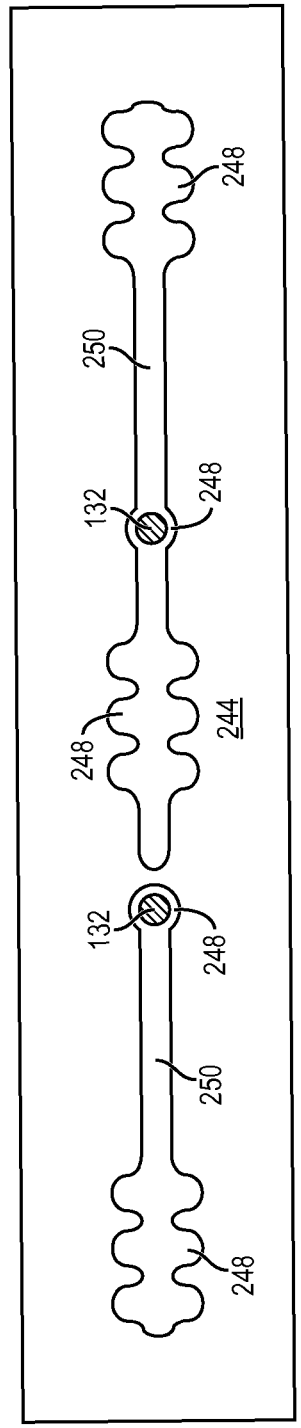

A first portion of insulating layer 244 is removed by a first LDA using laser 246 to form vias or openings 248. Some of the openings 248 expose conductive layer 132. Other openings 246 extend partially through insulating layer 244 and stop short of encapsulant 148, leaving about 2 μm of the insulating layer over the encapsulant. Openings 248 have a diameter of 15-60 μm. A second portion of insulating layer 244 is removed by a second LDA using laser 246 to form RDL trenches or channels 250, as shown in FIG. 11c. In one embodiment RDL trenches 250 have a depth of 4 μm. FIG. 11d shows a plan view of openings 248 and RDL trenches 250 formed in insulating layer 244. A wet cleaning is applied to remove stray particles and debris.

Figure 11E:
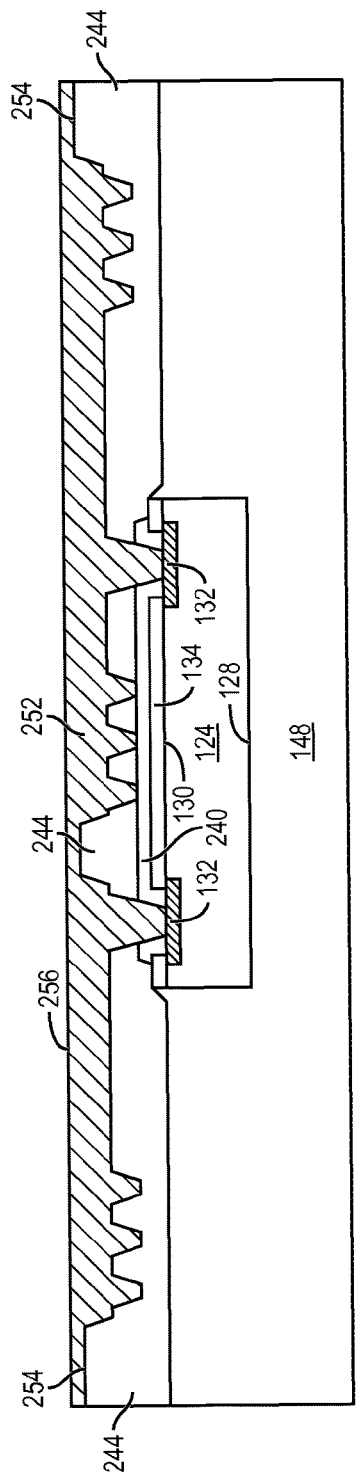

In FIG. 11e, an electrically conductive layer 252 is formed within openings 248 and RDL trenches 250 using an evaporation, electrolytic plating, electroless plating, or screen printing process. Conductive layer 252 can be one or more layers of Al, Cu, Sn, Ni, Au, Ag, or other suitable electrically conductive material. In one embodiment, conductive layer 252 includes a seed layer containing Ti/Cu or TiW/Cu and a blanket Cu plated layer extending above surface 254 of insulating layer 244. The plating process and ratio of alloys are controlled to achieve bottom-up plating, while maintaining surface 256 planar and minimizing the thickness of conductive layer 252 above surface 254 of insulating layer 244. For example, a step plating applies a pulse plating, followed by low current density DC plating, and high current density (>2.5 ASD) DC plating.

Figure 11F:
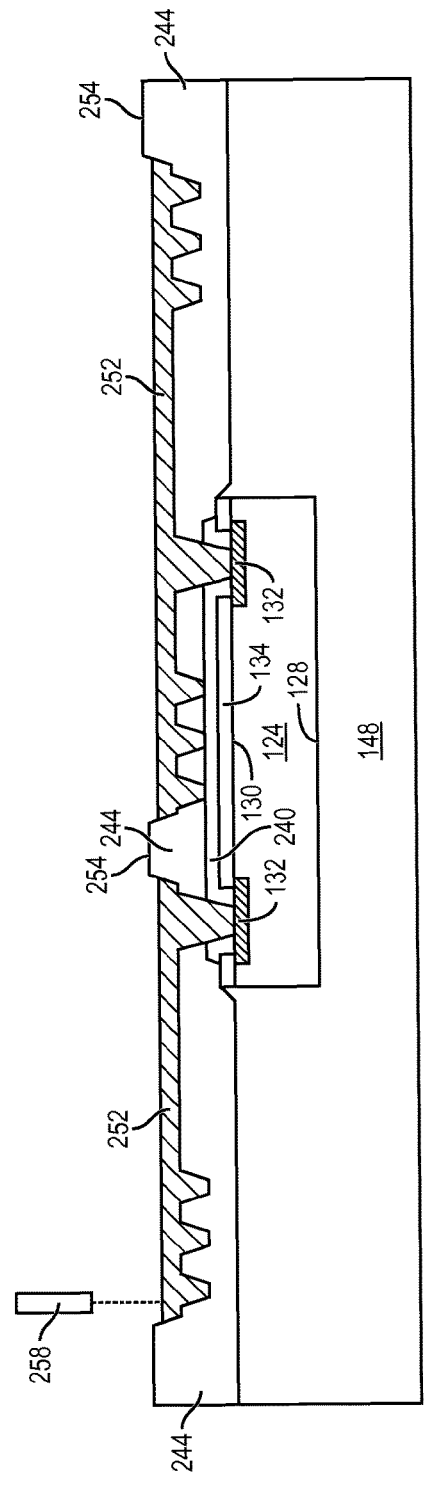

In FIG. 11f, a portion of conductive layer 252 is removed, e.g., by blanket wet etch, to reduce the thickness of the conductive layer below surface 254 of insulating layer 244. Alternatively, a portion of conductive layer 252 is removed by wet chemical etch followed by LDA using laser 258 or plasma dry etch to reduce the thickness of the conductive layer below surface 254 of insulating layer 244. Conductive layer 252 is annealed at less than 260° C., followed by wet cleaning.

Figure 11G:
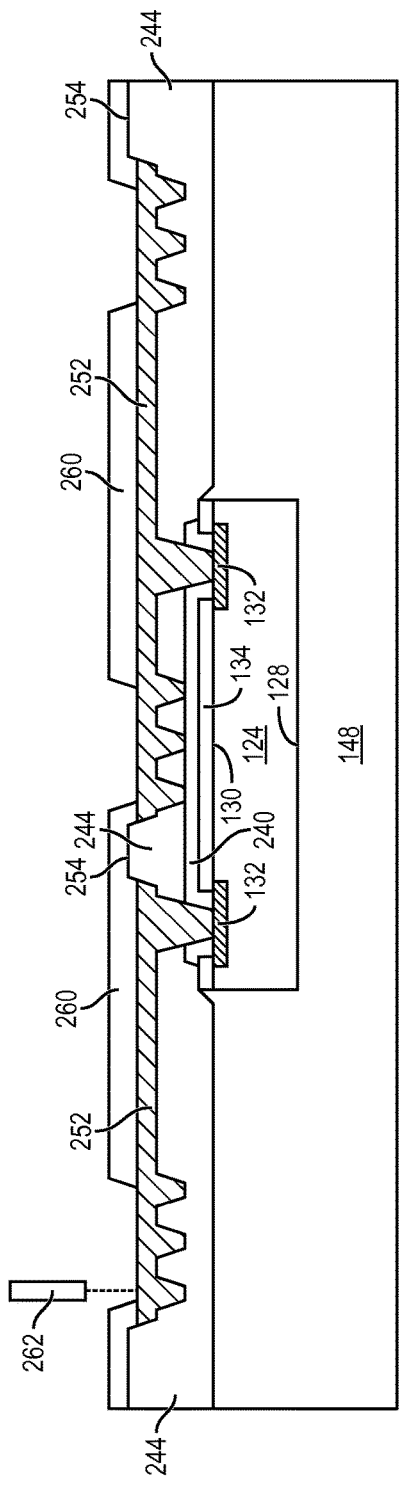

In FIG. 11g, an insulating or passivation layer 260 is formed over insulating layer 244 and conductive layer 252 using PVD, CVD, screen printing, spin coating, spray coating, sintering, lamination, or thermal oxidation. The insulating layer 260 contains one or more layers of SiO2, Si3N4, SiON, Ta2O5, Al2O3, HfO2, BCB, PI, PBO, or other suitable insulating material having similar properties. In particular, insulating layer 260 has tensile strength greater than 50 MPa, elongation greater than 40% at room temperature, and elongation greater than 15% at −55° C. A portion of insulating layer 260 is removed by LDA using laser 262 to expose conductive layer 252. The insulating layer 260 is cured at less than 260° C. After cure, the thickness of insulating layer 260 is about 5 μm.

Figure 11H:
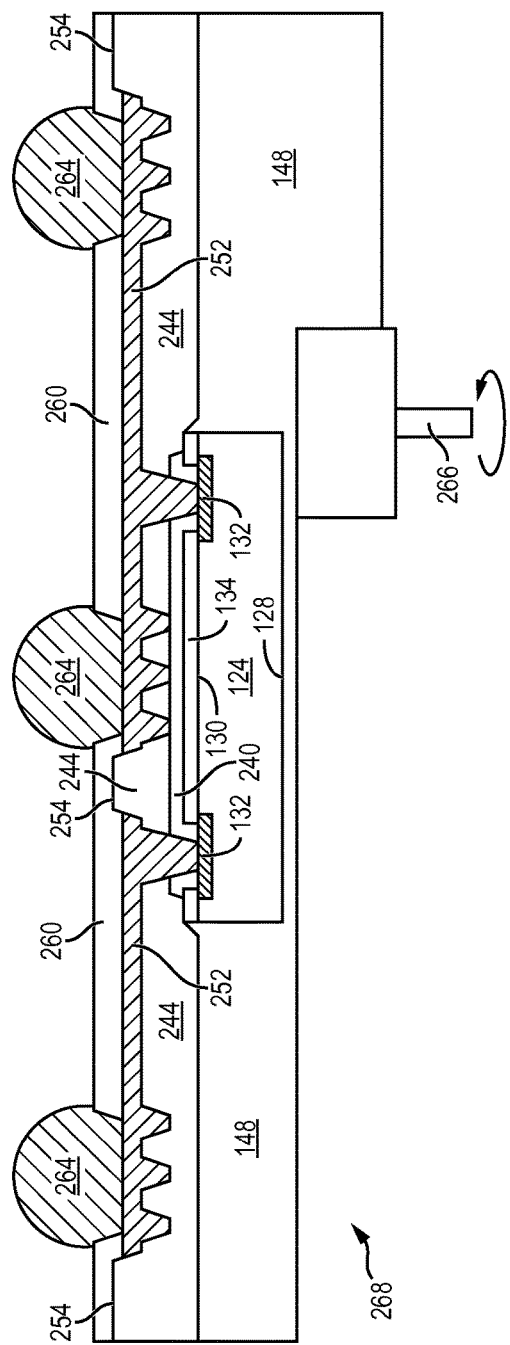

In FIG. 11h, an electrically conductive bump material is deposited over the exposed conductive layer 252 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 252 using a suitable attachment or bonding process. In one embodiment, the bump material is reflowed by heating the material above its melting point to form balls or bumps 264. In some applications, bumps 264 are reflowed a second time to improve electrical contact to conductive layer 252. Bumps 264 can also be compression bonded to conductive layer 252. Bumps 264 represent one type of interconnect structure that can be formed over conductive layer 252. The interconnect structure can also use stud bumps, micro bumps, or other electrical interconnect.

A portion of encapsulant 148 is removed by grinder 266 to planarize and reduce the package thickness. The reconstituted semiconductor wafer 144 is singulated through encapsulant 148 into individual Fo-WLCSP 268.

Figure 12:
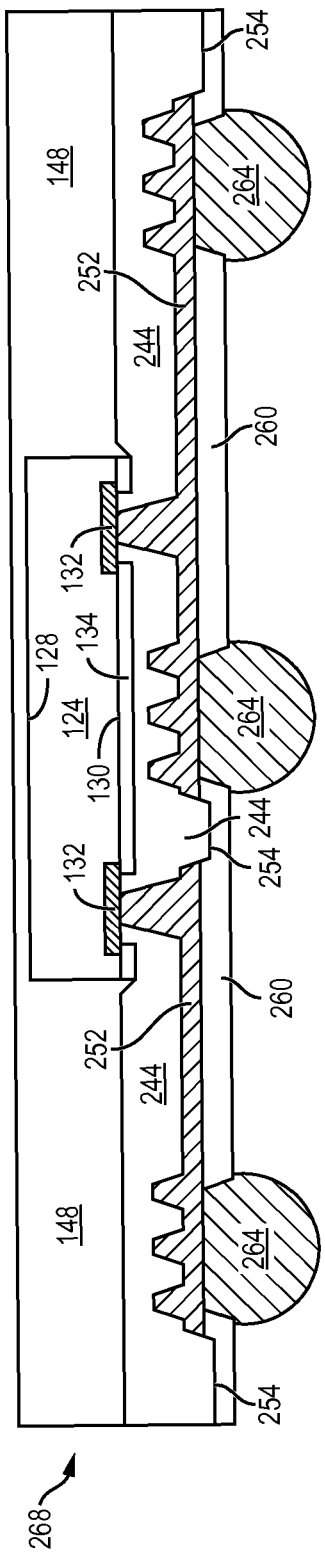
FIG. 12 illustrates a semiconductor die with a compliant layer formed over the active surface and RDL formed in openings and RDL trenches of the insulating layer according to FIGS. 11a-11h.

FIG. 12 shows Fo-WLCSP 268 after singulation. Semiconductor die 124 is electrically connected through conductive layer 252 to bumps 264. The insulating layer 244 receives a first LDA to form openings 248, followed by a second LDA to form RDL trenches 250 in the insulating layer for conductive layer 244. The first LDA and second LDA allow for the use of insulating layer 244 having good mechanical properties, such as tensile strength greater than 50 MPa, elongation greater than 40% at room temperature, and elongation greater than 15% at −55° C. Conductive layer 252 is formed within openings 248 and RDL trenches 250 of insulating layer 244. When formed, conductive layer 2252 18 extends above surface 254 of insulating layer 244. The thickness of conductive layer 252 is reduced to a level below surface 254 of insulating layer 244.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
a semiconductor die;
an encapsulant deposited over the semiconductor die and contacting a side surface of the semiconductor die, wherein a top surface of the semiconductor die is approximately coplanar with a top surface of the encapsulant;
a first insulating layer formed on the top surface of the semiconductor die and the top surface of the encapsulant, the first insulating layer including a first opening extending into the encapsulant through the top surface of the encapsulant outside a footprint of the semiconductor die, a second opening over the semiconductor die, and a trench extending completely between the first opening and second opening;
a conductive layer disposed within the trench, first opening, and second opening, wherein the conductive layer contacts the encapsulant below the top surface of the encapsulant within the first opening;
a second insulating layer formed over the conductive layer; and
a third opening formed completely through the encapsulant over the first opening to expose a portion of the conductive layer in the first opening.

2. The semiconductor device of claim 1, further including a third insulating layer formed over the semiconductor die.

3. The semiconductor device of claim 1, wherein the first insulating layer includes a tensile strength greater than 50 MPa, elongation greater than 40% at room temperature, and elongation greater than 15% at −55° C.

4. A semiconductor device, comprising:
a semiconductor die;
an encapsulant deposited over the semiconductor die;
a first insulating layer formed over the semiconductor die and encapsulant, including a trench in the first insulating layer to connect a first opening of the first insulating layer outside a footprint of the semiconductor die and a second opening of the first insulating layer, wherein the first opening of the first insulating layer extends into the encapsulant; and a conductive layer formed over the first insulating layer, wherein a portion of the conductive layer in the first opening of the first insulating layer is exposed through a first opening in the encapsulant.

5. The semiconductor device of claim 4, further including a second insulating layer formed over the conductive layer.

6. The semiconductor device of claim 5, further including a third insulating layer formed over the semiconductor die.

7. The semiconductor device of claim 4, further including a compliant passivation layer formed between the semiconductor die and first insulating layer.

8. The semiconductor device of claim 4, further including bumps formed over the conductive layer.

9. The semiconductor device of claim 4, wherein the first insulating layer includes a tensile strength greater than 50 MPa, elongation greater than 40% at room temperature, and elongation greater than 15% at −55° C.

10. A semiconductor device, comprising:
a semiconductor die;
an encapsulant deposited around the semiconductor die; and
a first insulating layer formed over the semiconductor die with a trench of the first insulating layer extending from a first opening of the first insulating layer outside a footprint of the semiconductor die and over the encapsulant to a second opening of the first insulating layer, wherein the encapsulant extends completely over the first opening of the first insulating layer.

11. The semiconductor device of claim 10, wherein the second opening of the first insulating layer is within the footprint of the semiconductor die.

12. The semiconductor device of claim 10, further including a compliant passivation layer formed over the semiconductor die.

13. The semiconductor device of claim 10, further including:

a conductive layer disposed in the trench of the first insulating layer; and
a bump formed over the conductive layer.

14. The semiconductor device of claim 10, wherein the first insulating layer includes a tensile strength greater than 50 MPa, elongation greater than 40% at room temperature, and elongation greater than 15% at −55° C.

15. A semiconductor device, comprising:
a semiconductor die;
an encapsulant disposed around the semiconductor die;
a second insulating layer formed on a first surface of the semiconductor die; and
a first insulating layer formed over the first surface of the semiconductor die, the encapsulant, and the second insulating layer, including a first opening in the first insulating layer outside a footprint of the semiconductor die extending into the encapsulant, and a trench extending from the first opening in the first insulating layer to the footprint of the semiconductor die.

16. The semiconductor device of claim 15, further including a bump formed over the trench.

17. The semiconductor device of claim 15, further including a third insulating layer formed over the semiconductor die between the first insulating layer and second insulating layer.

18. The semiconductor device of claim 4, further including:
a third opening of the first insulating layer outside the footprint of the semiconductor die; and
a conductive bump formed directly over each of the first and third openings.

19. The semiconductor device of claim 10, further including a conductive layer deposited into the trench of the first insulating layer and the first opening of the first insulating layer, wherein the conductive layer contacts the encapsulant through the first opening of the first insulating layer.

* * * * *